United States Patent [19]

Nagayasu et al.

[11] Patent Number: 5,684,836
[45] Date of Patent: Nov. 4, 1997

[54] RECEIVER WITH AUTOMATIC FREQUENCY CONTROL

[75] Inventors: Takayuki Nagayasu; Hiroshi Kubo, both of Kamakura, Japan

[73] Assignee: Mitsubishi Denki Kabushiki Kaisha, Tokyo, Japan

[21] Appl. No.: 466,217

[22] Filed: Jun. 6, 1995

[30] Foreign Application Priority Data

Dec. 22, 1994 [JP] Japan ..................................... 6-320598

[51] Int. Cl.⁶ .............................. H04L 27/22; H04B 7/10
[52] U.S. Cl. ........................ 375/326; 375/329; 375/347; 329/307; 329/346
[58] Field of Search ................................. 375/344, 316, 375/346, 347, 348, 349, 329, 330; 455/150.1, 161.1, 164.1, 182.1, 182.2, 192.1, 192.2, 296; 329/304, 306, 307, 346, 358, 360, 345

[56] References Cited

U.S. PATENT DOCUMENTS

| | | |
|---|---|---|
| 4,941,155 | 7/1990 | Chuang et al. . |
| 5,151,925 | 9/1992 | Gelin et al. . |
| 5,233,632 | 8/1993 | Baum et al. ............................. 375/344 |
| 5,311,545 | 5/1994 | Critchlow . |
| 5,400,362 | 3/1995 | Chennakeshu et al. ................ 375/285 |

FOREIGN PATENT DOCUMENTS 5-344172  4/1992  Japan .

Primary Examiner—Wellington Chin
Assistant Examiner—William Luther
Attorney, Agent, or Firm—Wolf, Greenfield & Sacks, P.C.

[57] ABSTRACT

In a receiver, a frequency offset estimating circuit inputs a received signal and a decision value from a decision circuit, and estimates a frequency offset. A CIR estimating circuit inputs the estimated frequency offset, the received signal and the decision value, and estimates CIR. A complex conjugate circuit calculates a complex conjugate of the CIR. A multiplication circuit multiplies the complex conjugate and the received signal. Receiving the multiplied value, the decision circuit outputs a decision value.

28 Claims, 10 Drawing Sheets

RECEIVER WITH AUTOMATIC FREQUENCY CONTROL

BACKGROUND OF THE INVENTION

1. Field of the Invention

This invention relates to a receiver with an automatic frequency control (called "AFC" hereinafter) function for use with digital data transmission applicable to land mobile communications and so on, and more particularly to a receiver with AFC in which values to be compensated according to a frequency offset can be converged rapidly, the frequency offset can be extensively compensated for, high precision reception characteristics can be realized even for a low C/N, and a receiver with diversity combining can be utilized.

2. Description of the Related Art

A carrier phase synchronizing circuit will be described prior to describing the technical background of the invention. A received signal $r_n$ can be expressed by the following equation.

$$r_n = c_n \cdot I_n + w_n \quad (1)$$

where $I_n$ denotes a transmitted signal, and $w_n$ denotes additive white Gaussian noise (called "AWGN" hereinafter). Here, the suffix n denotes time. To simplify the explanation, a transmitted signal is assumed to be binary PSK.

Referring to FIG. 20, the carrier phase synchronizing circuit up-converts (multiplies) a frequency of the received signal $r_n$ twice, thereby obtaining a signal expressed below.

$$r_n^2 = c_n^2 \cdot I_n^2 + 2c_n \cdot I_n \cdot w_n + w_n^2 \quad (2)$$

When substituting $\exp(j\Theta n)$ ($\Theta_n = 0, \pi$) for $I_n$, and $C_n \exp(j\gamma_n)$ for $c_n$ ($c_n$ is a positive real number), formula (3) is established.

$$c_n^2 \cdot I_n^2 \exp\{2j(\Theta_n + \gamma_n)\} = c_n^2 \exp(2j\gamma_n) \quad (3)$$

In the equation (3), $\exp(2j\Theta_n)$ is assumed to be 1.

An averaged $r_n^2$ approximates to $C_n^2(2j\gamma_n)$. When assuming that a smoothing phase of $c_n^2 \cdot I_n^2$ is $\beta$, a carrier phase $\gamma_n$ is either $\beta/2$ or $\beta/2+\pi$. This phenomenon is referred to as "phase ambiguity". Either $\beta/2$ or $\beta/2+\pi$ is selected for phase ambiguity according to estimation using a known training signal, or the like.

Frequency offset will be described hereinafter. A frequency converter removes a carrier frequency (carrier radian frequency $\omega_c$) from a received intermediate frequency (IF) signal and outputs the signal from a local oscillator and outputs the baseband signal. However, some residual frequency of the carrier remains in the signal. This residual frequency is called "frequency offset".

An output signal of the frequency converter is expressed by:

$$R_n \exp(-j\omega_0 nT) = r_n \exp(j(\omega_c - \omega_0)nT) \quad (4)$$

where the IF signal $R_n$ is represented by $\exp(j\omega_c nT)$, and $\omega_0$ denotes a converted radian frequency of the frequency converter. When $\omega_c \neq \omega_0$, a reference phase of the received signal is rotated by a rotation term, $\exp(j(\omega_c - \omega_0)nT)$, with the lapse of time. This means that a bit error rate will be increased and so the signal will be degraded. Here, $\Delta\omega = (\omega_c - \omega_0)T$ represents a normalized radian frequency offset, which is called "frequency offset" hereinafter.

Generally, the phase is defined as the scalar value $\theta$. In actual signal processing, the phase is expressed by a complex number such as $\cos\theta + j\sin\theta$ ($=\exp(j\theta)$). It is sometimes more convenient to use $\theta$ express as above. In the following description, the phase expressed by $\exp(j\theta)$ is called "the phase expressed by a complex variable". A operation to derive the scalar value $\theta$ from $\exp(j\theta)$ is called an "arctangent".

Phase jumping during the arctangent operation will be described hereinafter. When detecting a phase $\pi + \tau (\tau \geq 0)$ which is near $\pi$, a phase range to be detected is $[-\pi, \pi)$. A detected phase is $-\pi + \tau$, which is called "phase jumping".

If detected values are present around $\pi$ with variance $\sigma$, a smoothed result of values should be basically $\pi$. However, a detected and smoothed result value is 0 due to the phase jumping. Therefore, it is difficult to precisely detect the phases near $\pi$ or phases widely extending around $\pi$.

CIR (channel impulse response) $c_n$ is estimated in ways as described below. First, the CIR $c_n$ is derived using a known training signal. Assume that $c_n$ has a constant value c for all n, and that the training signal has a length K and is sufficiently random. An estimation value g of the CIR c is expressed as formula (5).

$$g = \sum_{n=0}^{K-1} r_n \cdot I_n^* / K \quad (5)$$

where * denotes a complex conjugate.

When the value of taps $c_n$ varies with time, an adaptive algorithm such as the LMS (least mean square) algorithm or RLS (recursive least square) algorithm is applicable.

The LMS algorithm will be described here. This algorithm is used to sequentially derive approximate values of Wiener solutions. In this case, the number of taps is controlled so as to minimize a mean square error between the received signal and its replica (estimated received signal). The LMS algorithm is expressed as shown below when the number of taps is 1.

$$g_{n+1} = g_n + \delta \cdot e_n \cdot I_n^* \quad (6)$$

$$e_n = r_n - g_n \cdot I_n \quad (7)$$

where $\delta$ is a step size, and $I_n$ is a reference input.

Soft decision will be described here. One of the coding methods is convolutional coding. The Viterbi algorithm is used as an optimum method for decoding convolutional codes. Data such as "0.1" or "0.9" including reliability (soft decision data) are input into the Viterbi algorithm in place of quantized binary data such as "0" or "1" (hard decision data) so as to reduce the error rate. Thus, the error rate can be improved when the convolutional codes are decoded on the basis of the soft decision data.

"Fading" is a phenomenon in which an envelope or a phase of a received signal vary at random when electromagnetic waves are reflected, diffracted, or scattered due to the topography of a surrounding area or by buildings. Especially, in the case of the land mobile communications, "Rayleigh fading" is remarkable. In this fading, phases are uniformly distributed, and envelopes are distributed according to Rayleigh distribution. An envelope power is often 20 dB or 30 dB smaller than average power. In such a case, the bit error rate will be extensively increased.

A diversity receiver comprises a plurality of antennas (N antennas), and detects a signal which is a combination of N received signals. Referring to FIG. 21, a diversity receiver includes N antennas and receives N signals.

The diversity receiver includes N antennas so that noise components and envelope components of the N signals are independent of one another. In other words, even if fading occurs in such a diversity receiver, it is unlikely that all of the N signals will have low envelope power. This is an advantage of the diversity receiver when fading occurs.

A diversity system called "post-detection combining diversity" will be described with reference to FIG. 21. It is assumed that the diversity receiver has N(=2) antennas 1 and 2, through which signals $r^{(1)}_n$ and $r^{(2)}_n$ are received. An equal-gain combining and a maximal-ratio combining will be described assuming that rms values (i.e. root mean squares of the envelope power) of signal components in the two received signals are $a^{(1)}_n$ and $a^{(2)}_n$ and that carrier phases are $\gamma^{(1)}_n$ and $\gamma^{(2)}_n$.

In the equal-gain combining, a combined signal is prepared on the basis of formula (8) regardless of the envelope power. In the maximal-ratio combining, the combined signal is calculated on the basis of formula (9).

$$r^{(1)}_n \exp(-j\gamma^{(1)}_n) + r^{(2)}_n \exp(-j\gamma^{(2)}_n) \quad (8)$$

$$a^{(1)}_n \cdot r^{(1)}_n \exp(-j\gamma^{(1)}_n) + a^{(2)}_n \cdot \gamma^{(2)}_n \exp(-j\gamma^{(2)}_n) \quad (9)$$

The latter combining is advantageous in that when one of the two antennas has a lower signal receiving level, weighing for such an antenna is reduced so as to effectively suppress noise.

A first example of the prior art receivers with the AFC function will be described with reference to FIG. 22. This receiver is realized on the basis of the lecture. "Performance of the PSK Baseband Differential Detector", No. B-360, given by Yukihiro Shimakata and Hideo Ohsawa at the 1991 ICICE General Conference.

Referring to FIG. 22, the receiver comprises a signal input terminal 220, an arctangent circuit 221, a delay circuit 222, a subtraction circuit 223, an addition circuit 224, a decision circuit 225, a subtraction circuit 226, a low-pass filter 227, and a terminal 228 for outputting a decision value of a phase. The arctangent circuit 221 inputs a received signal via the input terminal 220, and converts to a phase. The delay circuit 222 delays the phase by one symbol. The subtraction circuit 223 calculates the difference between the phase and the delayed phase. The addition circuit 224 calculates the sum of the difference from the subtraction circuit 223 and the output of the low-pass filter 227. The decision circuit 225 outputs decision data on the basis of the sum from the addition circuit 224. The subtraction circuit 226 calculates the difference between the output of the decision circuit and the sum from addition circuit 224. The low-pass filter 227 smoothes the difference from the subtraction circuit 226.

Operation of this receiver will be described. It is assumed that a 4-ary PSK signal is received by the receiver. The delay circuit 222 inputs a phase of the received signal from the arctangent circuit 221, delays the signal by one symbol, and outputs a delayed signal. The subtraction circuit 223 calculates the difference between the delayed phase and the phase, and provides the difference to the addition circuit 224.

In this case, the received signal $r_n$ is expressed by formula (10), in which noise in the signal is not taken into consideration, and $\Delta\omega$ denotes a frequency offset. An output of the subtraction circuit 223 is expressed by formula (11).

$$r_n = c_n \exp(j(\Theta_n + \Delta\omega_n)) \quad (10)$$

$$(\Theta_n + \Delta\omega_n) - (\Theta_{n-1} + \Delta\omega(n-1)) = (\Theta_n - \Theta_{1-n})\Delta\phi \quad (11)$$

In this case, $c_n$ is a constant value c, $\Theta_n$ is a phase in the received signal, and $\Theta_n = \pi i/2 + \pi/4 (i=0, 1, 2, 3)$.

The addition circuit 224 calculates the sum of a frequency offset compensating value $\phi_n$ (output by the smoothing circuit 227) and the difference (from the subtraction circuit 223), and the sum is thereby expressed by formula (12).

$$(\Theta_n - \Theta_{n-1}) + \Delta\omega + \phi_n \quad (12)$$

When the output signal from the addition circuit 224 is within the range of $[0, \pi/2)$, the decision circuit 225 determines that a difference $\Theta_n - \Theta_{n-1}$ between a signal at time n and a signal at time n−1 is $\pi/4$. When the output is within the range of $[\pi/2, \pi)$, the difference $\Theta_n - \Theta_{n-1}$ is determined to be $3\pi/4$. Further, when the output is within the range of $[\pi, 3\pi/4)$, the difference $\Theta_n - \Theta_{n-1}$ is determined to be $5\pi/4$. Still further, when the output is within the range of $[3\pi/2, 2\pi)$, this difference $\Theta_n - \Theta_{n-1}$ is determined to be $7\pi/4$. Then, the decision value will be output via the terminal 228.

The subtraction circuit 226 subtracts the output expressed by formula (12) from the decision value (from the decision circuit 225), and gives an output signal expressed by formula (13). In this case, the decision circuit 225 is assumed to be free from errors.

$$\epsilon_n = -\Delta\omega - \phi_n \quad (13)$$

In the case of $\epsilon_n > 0$, the low-pass filter 227 gradually increases $\phi_n$ so as to make $\epsilon_n$ approximate to 0. Conversely, when $\epsilon_n < 0$, the low-pass filter 227 gradually reduces $\phi_n$, thereby making $\epsilon_n$ approximate to 0.

However, when an absolute value of the frequency offset is greater than $\pi/4$, the decision circuit 225 makes an incorrect decision. In other words, a maximum frequency offset to be compensated is less than $\pi/4$ in this example. If the frequency offset is above $\pi/4$, an estimation error of $\pi/2$ or greater will be caused at an input of the low-pass filter 227. Since a problem resulting from the incorrect decision is extensively influential in this example, it is very difficult to accomplish precise and reliable transmission characteristics for a low C/N where incorrect decision tends to occur.

A time constant of the low-pass filter 227 should be large so as to sufficiently suppress a variation of the frequency offset compensating value. The larger the time constant, the more slowly the compensating values will converge. Further, the receiver of this example can not be applied the diversity combining to reduce the bit error rate, so that reception characteristics thereof are somewhat inferior to those with diversity combining.

A second example of the prior art receiver with the AFC function will be described with reference to FIG. 23. This receiver is similar to a receiver with the AFC function disclosed in "Frequency Offset Compensating Method", Japanese Patent Laid-Open Publication No. Hei 5-344,172 by Hiroyasu Ishikawa, et al.

Referring to FIG. 23, the receiver comprises a signal receiving terminal 231, a delay circuit 232, a multiplication circuit A 233, a low-pass filter 234, an L-multiplication circuit 235, a smoothing circuit 236, an L-divider 237, a complex conjugate circuit 238, a multiplication circuit B 239, a decision circuit 2310, and a terminal 2311 for outputting a decision value. The delay circuit 232 delays a signal (received via the input terminal 231) by one symbol $(T_s)$. The multiplication circuit A 233 multiplies the received signal by the delayed signal (from the delay circuit 231). The L-multiplication circuit 235 multiplies an output (from the low-pass filter 234) by L. The complex conjugate circuit 238 outputs a complex conjugate of an output signal (from the L-divider 237). The multiplication circuit B 239 multiplies the output (of the low-pass filter 234) by the multiplied value (of the complex conjugate circuit 238).

Operation of the receiver will be described hereinafter. It is assumed that a 4-ary PSK (L=4) signal arrives at the receiver. The multiplication circuit A 233 multiplies the received signal (via the input terminal 231) by a signal delayed by one symbol (in the delay circuit 232), and outputs a product. The low-pass filter 234 eliminates harmonic components from the product, and outputs a signal indicative of a differential detection result.

The received signal $r_n$ is expressed by formula (14) when no noise is taken into consideration, where $\Delta\omega$ denotes frequency offset. The output signal of the low-pass filter 234 is expressed by formula (15).

$$r_n = c_n \exp(j(\Theta_n + \Delta\omega n)) \quad (14)$$

$$c_2 \exp(j(\Theta_n - \Theta_{n-1} + \Delta\omega)) \quad (15)$$

where $c_n$ is a constant value C (C=1 assumed hereinafter), $\Theta_n$ is a phase of the transmitted signal and is $\pi i/2 + \pi/4$ (i=0, 1, 2, 3).

The L-multiplication circuit 236 multiplies the differential detection result by four times, thereby obtaining a signal expressed by formula (16).

$$\exp(j4(\Theta_n - \Theta_{n-1} + \Delta\omega)) = \exp(j(4(\Theta_n - \Theta_{n-1} + 4\Delta\omega))) \quad (16)$$
$$= \exp(j4\Delta\omega)$$

where $4(\Theta_n - \Theta_{n-1}) = 2\pi i$ is used (i is an integer).

The phase expressed by formula (16) corresponds to a quadruplicated frequency offset. The smoothing circuit 236 adds N outputs of the L-multiplication circuit 235, and smoothes the outputs. The L-divider 237 divides the smoothed value into four, and outputs it as an estimate $\exp(j\Delta\omega')$ of the frequency offset expressed by the complex variable. The complex conjugate circuit 238 calculates a complex conjugate of the frequency offset expressed in the form of the complex variable, and outputs the calculated cofrequency offsets a frequency offset compensating value.

The multiplication circuit 239 multiplies the differential detection result (from the low-pass filter 234) and the frequency offset correcting value $\exp(-j\Delta\omega')$, thereby eliminating the frequency offset from the differential detection result. Thus, the output of the multiplication circuit B 239 is expressed by formula (17). When the frequency offset is precisely estimated (i.e. $\Delta\omega' = \Delta\omega$), the formula (17) is rewritten into formula (18).

$$\exp(j(\Theta_n - \Theta_{n-1} + \Delta\omega - \Delta\omega')) \quad (17)$$

$$\exp(j(\Theta_n - \Theta_{n-1})) \quad (18)$$

The decision circuit 2310 performs the hard decision of the output from the multiplication circuit B 239, and outputs the result via the decision value output terminal 2311. In this example, the transmitted signal is differentially coded twice so as not to narrow a range in which the frequency offset is estimated. Further, the signal is differentially decoded before it is applied to the decision circuit.

In the foregoing example, the modulated components of the received signal are eliminated by the multiplication process. However, since the multiplication process equivalently degrades the performance vs. C/N, it is impossible to accomplish very precise performance of the receiver at a low C/N. Use of the differential detection for the demodulation increases the bit error rate in comparison with the coherent detection. The receiver without diversity combining is disadvantageous compared with the receiver with the diversity combining.

A third example of the prior art receiver using the diversity reception will be described with reference to FIG. 24. This example is identical to "A diversity Radio Receiver" proposed by Hideaki Omori et al. in Japanese Patent Laid-Open Publication No. Hei 6-090225.

In FIG. 24, reference numerals represents the following: 241-1 and 241-2 signal receiving terminals; 242-1 and 242-2 oscillators A1 and A2; 243-1 and 243-2 multiplication circuits A1 and A2 for multiplying a signal received via the terminals (241-1 and 241-2) and an output of the oscillators A1 (242-1) and A2 (242-2); 244-1 and 244-2 band-pass filters A1 and A2; 245 an addition circuit; 246 a band-pass filter B; 247 a delay circuit for delaying an output of the band-pass filter B 246 by M symbols ($MT_s$); 248 a multiplication circuit B; 249 a band-pass filter having a band width above the Nyquist frequency; 2410 a combined signal outputting terminal.

In operation, the multiplication circuits A1 (243-1) and A2 (248-2) multiply signals (received via terminals 241-1 and 241-2) and sine wave signals (output from the oscillators A1 (242-1) and A2 (242-2)) together, and output multiplied signals. The band-pass filters A1 (244-1) and A2 (244-2) eliminate unnecessary components such as harmonics from the multiplied signals, and output IF (intermediate frequency) signals as the received signals.

When a nominal IF frequency is assumed to be $f_i$, oscillation frequencies of the oscillators A1 (242-1) and A2 (242-2) should be determined such that respective IF signals may be expressed by formulas (19) and (20).

$$R_1 \cos((\omega_i + 2\pi m/MT_s)t + \Theta(t) + \theta_1) \quad (19)$$

$$R_2 \cos((\omega_i + 2\pi n/MT_s)t + \Theta(t) + \theta_2) \quad (20)$$

$$|m - n| >> M/2 \quad (21)$$

where m and n are integers to satisfy formula (21), $R_1$ and $R_2$ are amplitudes of IF signals at respective branches, $\theta_1$ and $\theta_2$ are phases of received IF signals at respective branches, and $\Theta(t)$ is a modulation component.

The addition circuit 245 adds outputs of the band-pass filters A1 (244-1) and A2 (244-2), expressed by formulas (19) and (20), and outputs a sum. The band-pass filter B 245 limits a band of this signal, thereby outputting a signal expressed by formula (22).

$$R_1 \cos((\omega_i + 2\pi m/MT_s)t + \Theta(t) + \theta_1) \quad (22)$$
$$+ R_2 \cos((\omega_i + 2\pi n/MT_s)t + \Theta(t) + \theta_2)$$

The multiplication circuit B 248 multiplies the output signal of the band-pass filter B 245 and a signal (delayed for M symbol by the delay circuit 247) together, and outputs a product. The band-pass filter C 249 eliminates harmonics from the signal, and emits a differential detection output signal expressed by formula (23).

$$R_1^2/2\cos(\Theta(t) - \Theta(t - MT_s) + \omega_i MT_s + 2\pi m) + \quad (23)$$
$$R_2^2/2\cos(\Theta(t) - \Theta(t - MT_s) + \omega_i MT_s + 2\pi n) +$$
$$R_1 R_2/2\cos((m - n)/MT_s) \cdot t +$$
$$\omega_i MT_s + 2\pi n + \Theta(t) - \Theta(t - MT_s) + \theta_1 - \theta_2) +$$
$$R_1 R_2/2\cos((n - m)/MT_s) \cdot t +$$
$$\omega_i MT_s + 2\pi n - \Theta(t) + \Theta(t - MT_s) - \theta_1 + \theta_2)$$

In formula (23), the signals expressed by the third and fourth terms can be blocked by varying the band of the band-pass filter C 249 to the Nyquist band. In this case, the output signal of the band-pass filter C 249 is expressed by formula (24).

$$R_1^2/2\cos(\Theta(t) - \Theta(t - MT_s) + \omega_i MT_s + 2\pi m) + \quad (24)$$
$$R_2^2/2\cos(\Theta(t) - \Theta(t - MT_s) + \omega_i MT_s + 2\pi n) =$$
$$R_1^2/2\cos(\Theta(t) - \Theta(t - MT_s) + \omega_i MT_s) +$$
$$R_2^2/2\cos(\Theta(t) - \Theta(t - MT_s) + \omega_i MT_s) =$$
$$(R_1^2 + R_2^2)/2\cos(\Theta(t) - \Theta(t - MT_s) + \omega_i MT_s)$$

The signal expressed by formula (24) is output via a synthesized signal outputting terminal 2410 as an equal-gain combining signal after the differential detection.

In the foregoing example, the received signal is synthesized in the IF band, so that it is difficult for the receiver circuit to be digitalized. Further, since no maximal-ratio combining is used, the receiver has poor performance compared with a diversity receiver using the maximal-ratio combining. Still further, since the demodulation is performed using the differential detection, the bit error rate of the receiver is not as good as that of the coherent detection.

As described above, the existing receivers with the AFC function are prone to the following problems.

First of all, in the receiver of the first example, the compensating values are slow to converge due to the frequency compensation. Thus, a range of frequency offsets to be compensated for is narrow.

Secondly, in the first and second examples, having the receivers with the AFC function and the diversity receiver (the third example), it is very difficult to accomplish very precise reception characteristics at a low C/N.

Finally, the receivers with the AFC function (examples 1 and 2) do not use the diversity reception, and the diversity receiver (the third example) does not use the maximal-ratio combining function. Thus, such receivers have poor performance compared with the receiver utilizing the maximal-ratio combining.

SUMMARY OF THE INVENTION

The present invention is intended to overcome the foregoing problems of the prior art receivers. According to the invention, a receiver can converge values for compensating frequency offsets rapidly, and can compensate for frequency offsets in a wide frequency band. The receiver can assure precise and reliable performance at a low C/N, and is compatible with diversity reception with maximal-ratio combining, thereby accomplishing automatic frequency control.

In a first aspect of the invention, there is provided a receiver comprising: data decision means for inputting a received signal, a frequency offset of the received signal and CIR depending upon a carrier phase and amplitude, and for outputting a decision value as an estimated value of data contained in the received signal; CIR estimating means for estimating CIR on the basis of the signal indicative of the decision value from the data decision means or known information about the received signal, the frequency offset of the received signal, and the CIR depending upon the carrier phase and amplitude; and frequency offset estimating means for estimating a frequency offset of the received signal on the basis of the decision value, and a decision value, delayed by M (M=an integer equal to or greater than 1) symbols or known information about the received signal, the received signal, and the delayed signal which is delayed by M symbols. Thus, the receiver performs automatic frequency control and simultaneously compensates frequency offsets precisely and reliably.

According to a second aspect, there is provided a receiver comprising: data decision means for inputting a received signal whose phase or amplitude is compensated, and outputting a signal indicative of a decision value as an estimated value of data contained in the received signal; CIR estimating means for estimating CIR on the basis of the decision value or known information about the received signal; frequency offset estimating means for estimating a frequency offset of the received signal on the basis of the decision value, and a decision value delayed by M (M=an integer equal to or greater than 1) symbols or known information about the received signal, the received signal, and the received signal delayed by M symbols; and means for compensating a phase and/or amplitude of the received signal in accordance with the CIR received from the CIR estimating means. Therefore, the receiver not only performs automatic frequency control but also compensates frequency offsets precisely and reliably.

With a third aspect of the invention, the frequency offset estimating means estimates a frequency offset on the basis of the received signal, the signal arriving M (M=an integer equal to or greater than 1) symbols before, and known information about the received signal. Thus, frequency offsets can be compensated precisely and reliably without being influenced by incorrect decision.

In a fourth aspect of the invention, the frequency offset estimating means includes: S frequency offset estimating means for estimating a frequency offset of the received signal on the basis of the decision value, and a decision value delayed by $M_1, M_2, \ldots,$ or $M_s$ symbols (S is an integer equal to or greater than 2) or known information about the received signal, and the received signal and a received signal delayed by $M_1, M_2, \ldots,$ or $M_s$ symbols; and fine control means for fine-controlling the frequency offsets received from the S frequency offset estimating means. Thus, a frequency offset can be estimated precisely and reliably over a wide frequency band.

Further, the frequency offset estimating means further includes: a first frequency offset estimating circuit for inputting the decision value or known information about the received signal, and for estimating a first frequency offset of the received signal on the basis of the decision value of the received signal and the decision value delayed by $M_1$ symbols or known Information about the received signal, the received signal and the received signal delayed $M_1$ symbols; and a (i+1)-th frequency offset estimating circuit for estimating an (i+1)-th frequency offset of the received signal on the basis of the decision value of the received signal and the decision value delayed by $M_{i+1}$ symbols or known information about the received signal, an i-th estimated frequency offset derived by an i-th frequency offset estimating means (i=1~S−1; S=an integer equal to or greater than 2), the received signal, and the received signal delayed $M_{i+1}$ symbols. Thus, frequency offsets can be estimated precisely and reliably over a wide frequency band.

In a sixth aspect of the invention, the frequency offset estimating means estimates a frequency offset on the basis of the decision value or known information about the received signal, and the CIR estimated by the CIR estimating means. The receiver can precisely compensate frequency offset using a relatively small circuit.

With a seventh aspect of the invention, the frequency offset estimating means or a j-th (j=1~S, S being an integer equal to or greater than 2) frequency offset estimating means includes: phase difference detecting means for detecting phase difference between the received signal and the received signal which is delayed by M symbols, on the basis of the decision value, and a decision value delayed by M symbols or known information about the received signal the received signal and the received signal delayed by M symbols, and phase difference smoothing means for smoothing the phase difference detected by the phase difference detecting means, and outputting the estimated frequency offset.

In an eighth aspect of the invention, there is provided a receiver comprising: data decision means for inputting N (an integer equal to or greater than 1) received signals; an estimated frequency offset of the received signals and CIR depending upon a carrier phase and amplitude, and outputting a decision value of the received signals; CIR estimating means for estimating CIR on the basis of the decision value from the data decision means or known information about the received signals, and the estimated frequency offset of the received signal, the CIR composed of the carrier phase and amplitude; and frequency offset estimating means for estimating a frequency offset on the basis of the decision value, and a decision value delayed by M (M=an integer equal to or greater than 1) symbols or known information about the N received signals, the N received signals, and the received signal which is delayed by M symbols. The receiver performs automatic frequency control using the estimated frequency offset.

According to ninth aspect of the invention, there is a receiver provided comprising: data decision means for inputting a signal which is made up of N combined (an integer equal to or greater than 1) received signals, and outputting decision values of the received signals; CIR estimating means for estimating CIR of the N received signals on the basis of the decision values from the date decision means, or known information about the received signals, and estimated frequency offset of the combined signal; frequency offset estimating means for estimating frequency offsets of the combined signal on the basis of the decision values and a decision value delayed by M (M=an integer equal to or greater than 1) symbols, or known information about the received signals, the N received signals, and the N received signals delayed by M symbols; and combining means for combining the N received signals on the basis of the CIR thereof. Thus, the receiver performs automatic frequency control using the estimated frequency offset.

In a tenth aspect of the invention, the frequency offset estimating means estimates a frequency offset on the basis of the N received signals, the N received signals delayed by M (an integer equal to or greater than 1) symbols, and known information about the received signals.

With an eleventh aspect of the invention, the frequency offset estimating means includes: S (S is an integer equal to or greater than 2) frequency offset estimating means for estimating a frequency offset of the combined signal on the basis of the decision value and a decision value delayed by $M_1, M_2, \ldots,$ or $M_s$ symbols or known information about the received signal, the N received signals, and the N received signals delayed by $M_1, M_2, \ldots,$ or $M_s$ symbols; and fine control means for fine-controlling the estimated frequency offsets received from the S frequency offsets estimating means.

According to a twelfth aspect of the invention, the frequency offset estimating means further includes: a first frequency offset estimating means for inputting the decision value and the N received signals, and for estimating a first frequency offset of the combined signal on the basis of the decision value and of the combining signal and the decision value delayed by $M_1$ symbols or known information about the received signal, the N received signals and the N received signals delayed $M_1$ symbols; and a (i+1)-th frequency offset estimating means for estimating an (i+1)-th frequency offset of the combining signals on the basis of the decision value of the combining signal and the decision value delayed by $M_{i+1}$ symbols or known information about the received signals, an i-th estimated frequency offset derived by an i-th frequency offset estimating means (i=1~S−1; S=an integer equal to or greater than 2), the N received signals, and the N received signal delayed $M_{i+1}$ symbols.

With a thirteenth aspect of the invention, the frequency offset estimating means estimates a frequency offset on the basis of the decision value or known information about the currently received signals, the N received signals, and the N CIRs estimated by the N CIR estimating means, respectively.

According to a fourteenth aspect, the frequency offset estimating means or a j-th (j=1~S, S being an integer equal to or greater than 2) frequency offset estimating means includes: phase difference detecting means for detecting phase differences between the combined signal and the combined signal delayed by M symbols on the basis of the decision value and a decision value delayed by M symbols or known information about the received signals, the N received signals, the N received signals delayed by M symbols; and phase difference smoothing means for smoothing the phase differences detected by the phase difference detecting means, and outputting the estimated frequency offset.

With a fifteenth aspect, the phase difference detecting means outputs phase differences expressed by complex variables, and the phase difference smoothing means includes arctangent calculating means for receiving the phase differences between the span of M symbols from the phase difference detecting means, converting the phase differences to phases, and outputting the phases, and smoothing means for smoothing the phases and divided by M so as to estimate a phase difference per symbol. The phase differences are represented by complex variables, e.g. it is assumed that a cosine value is a real part while a sine value is an imaginary part. Thus, phases can be calculated after the smoothing process, so that phase jumping can be prevented.

With a final aspect of the invention, the phase difference detecting means outputs a signal indicative of phase differences expressed by complex variables, and the phase difference smoothing means includes smoothing means for smoothing the phase differences between span of M symbols and expressed by complex variables, arctangent calculating means for receiving the phase differences averaged by the smoothing means, converting the phase differences into complex variables to phases, and outputting the phases, and dividing means for receiving the phases and calculating a phase difference per symbol.

The phase differences are represented by complex variables, e.g. it is assumed that a cosine value is a real part while a sine value is an imaginary part. Thus, phases can be calculated prior to the smoothing process, so that circuit configuration can be simplified and it is possible to reduce rounding error caused by the arctangent calculation if the arctangent calculation is coarse.

Time constants used for the smoothing step can be minimized compared with those used for receivers of the prior art. This is because a frequency offset is estimated on the basis of decision values obtained by the decision means or known information about received signals, and on the basis of phase differences between spans of M symbols. Thus, a frequency offset can be estimated precisely and rapidly. Further, influence of incorrect decision can be reduced to 1/M compared with that of the prior art receiver, so that the receiver can operate reliably even when incorrect decision tends to occur rather frequently.

Diversity reception using maximal-ratio combining can be accomplished on the basis of the estimated frequency offset and CIR estimated on the basis of decision values and received signals.

BRIEF DESCRIPTION OF THE DRAWINGS

In all the drawing figures, identical parts are assigned identical reference numerals.

DESCRIPTION OF THE PREFERRED EMBODIMENTS

Figure 1:
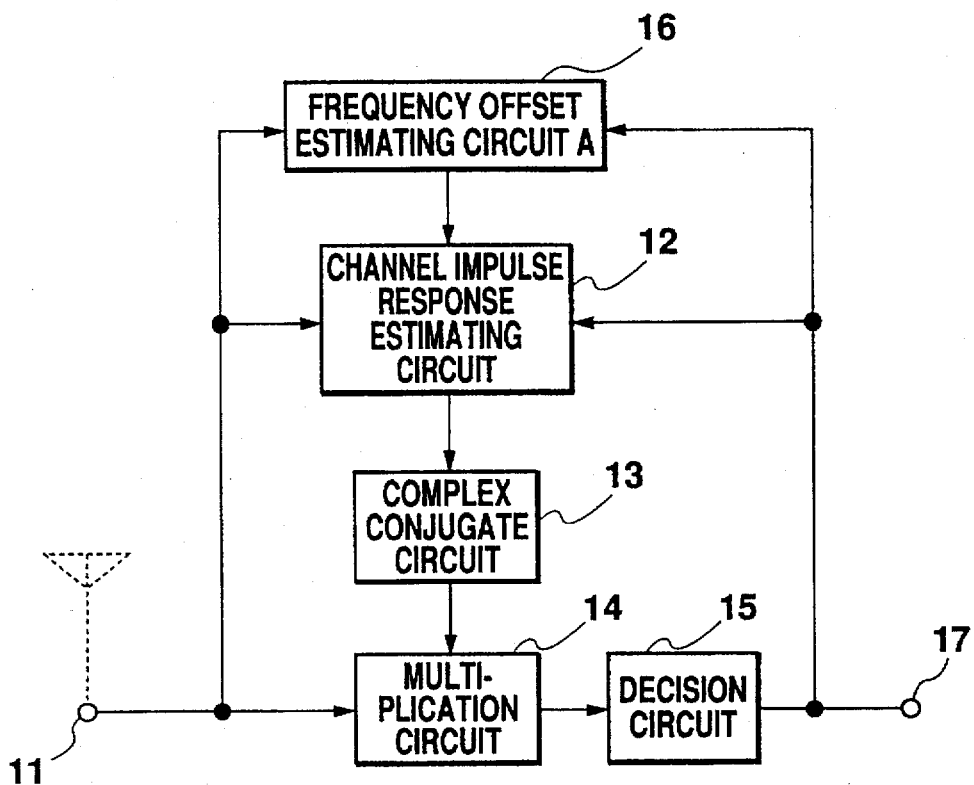
FIG. 1 is a schematic view showing the configuration of a receiver with the AFC function, according to a first embodiment of the invention.

The invention will be described with reference to embodiments shown in the drawing figures.

Embodiment 1

Referring to FIG. 1, a receiver with the AFC function comprises a signal receiving terminal 11, a CIR estimating circuit 12, a complex conjugate circuit 13, a multiplication circuit 14, a decision circuit 15, a frequency offset estimating circuit A 16, and a decision value output terminal 17. The CIR estimating circuit 12 estimates CIR on the basis of a received signal via the signal input terminal 11, a decision value from the decision circuit 15 and a frequency offset from the frequency offset estimating circuit A16. The complex conjugate circuit 13 calculates a complex conjugate of the CIR (output by the CIR estimating circuit 12). The multiplication circuit 14 multiplies the complex conjugate (from the complex conjugate circuit 13) and the received signal together. The decision circuit 15 receives the multiplied value from the multiplication circuit 14, and outputs a signal decision value as an estimated value of transmitted data. The frequency offset estimating circuit A 16 estimates frequency offset on the basis of the decision value form the decision circuit 15 and the received signal.

Figure 2:
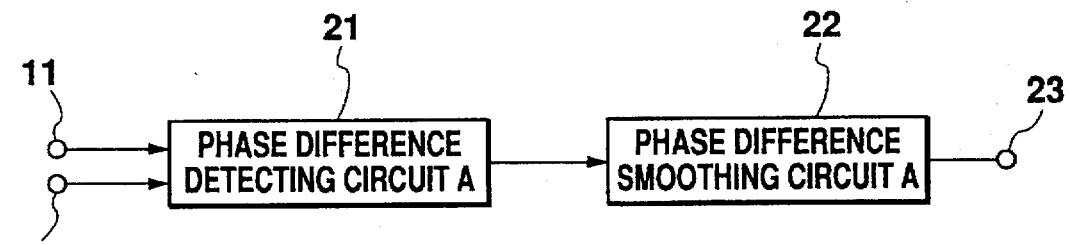
FIG. 2 shows the configuration of a frequency offset estimating circuit A of the receiver shown in FIG. 1.

As shown in FIG. 2, the frequency offset estimating circuit A 16 comprises a phase difference detecting circuit A 21 and a phase difference smoothing circuit A 22. The phase difference detecting circuit A 21 inputs the received signal via the input terminal 11 and the decision value via the terminal 17, and detects phase differences. The phase difference smoothing circuit 22 smoothes the phase differences output from the phase difference detecting circuit A 21, and outputs an estimated value of the frequency offset. The estimated frequency offset value is output via a terminal 23.

The phase difference detecting circuit A 21 comprises a received signal phase difference detecting circuit A 31, a decision value phase difference detecting circuit A 32, a complex conjugate circuit 33, and a multiplication circuit. The received signal phase difference detecting circuit A 31 detects a phase difference of the received signal, and outputs the detected phase difference (a complex variable indicating an M-symbol-differential-detected result of the received signal in the complex variable form). The decision value phase difference detecting circuit A 32 detects a phase difference of the decision value (a complex variable representing a phase difference in the decision value for M symbols) received via the decision value input terminal 17. The complex conjugate circuit 33 calculates a complex conjugate of the phase difference of the decision value. The multiplication circuit 34 multiplies the complex conjugate and the phase difference (a complex variable indicating an M-symbol-differential-detected result of the received signal) of the received signal.

Figure 3:
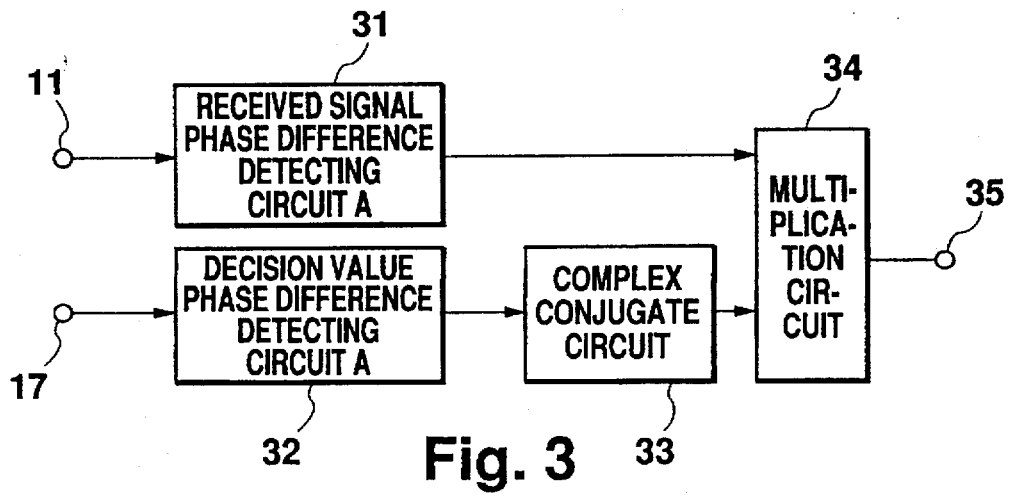
FIG. 3 shows the configuration of a phase difference detecting circuit A of the frequency offset estimating circuit of FIG. 2.
Figure 4:
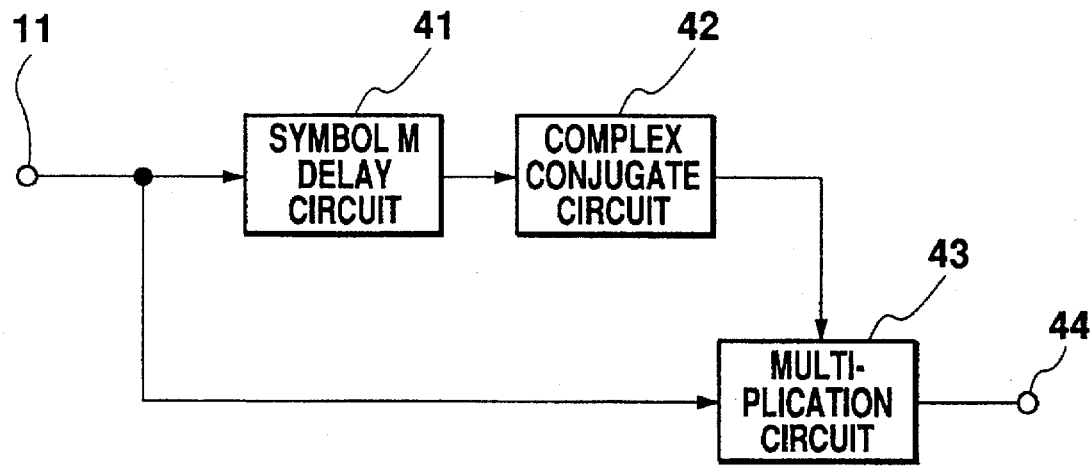
FIG. 4 shows the configuration of a received signal phase difference detecting circuit in the phase difference detecting circuit of FIG. 3.

The received signal phase difference detecting circuit A 31, shown in FIG. 4, includes an M-symbol delay circuit 41, a complex conjugate circuit 42, and a multiplication circuit 43. The M-symbol delay circuit 41 delays a signal (received via the input terminal 11) by M symbols. The complex conjugate circuit 42 calculates a complex conjugate of the delayed signal (from the M-symbol delay circuit 41). The multiplication circuit 43 multiplies the received signal and the complex conjugate together. In FIG. 4, reference numeral 44 denotes a terminal for outputting a received signal phase difference. The decision value phase difference detecting circuit A 32 (shown in FIG. 3) can be configured in the same manner as that of the received signal phase difference detecting circuit A 31 (shown in FIG. 4).

Figure 5:
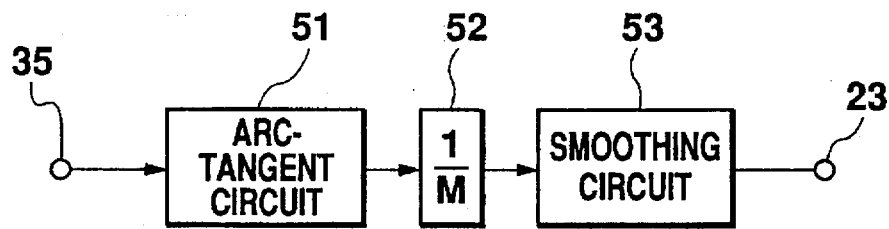
FIG. 5 shows the configuration of a phase difference smoothing circuit A of the frequency offset estimating circuit shown in FIG. 2.

Referring to FIG. 5, the phase difference smoothing circuit A 22 (FIG. 2) includes a phase difference input terminal 35, an arctangent circuit 51, a dividing circuit 52, a smoothing circuit 53, and a frequency offset output terminal 23. The arctangent circuit 51 calculates an arctangent value of the phase difference received via the input terminal 35. The dividing circuit 52 divides the arctangent by M. The smoothing circuit 53 smoothes the divided values, and outputs an estimate of frequency offset.

Figure 6:
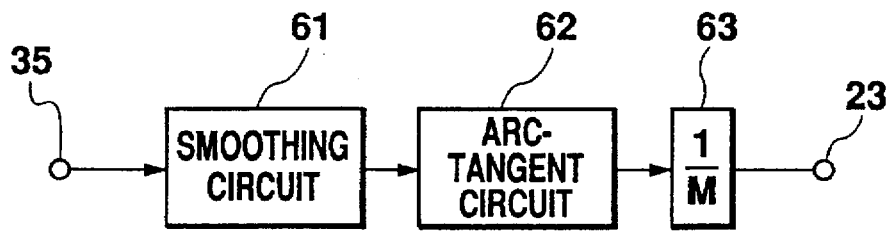
FIG. 6 shows the configuration of another phase difference smoothing circuit A.

FIG. 6 shows another example of the phase difference smoothing circuit A 22 of FIG. 2. This example includes the phase difference input terminal 85, a smoothing circuit 61, an arctangent circuit 62, a dividing circuit 68, and a frequency offset output terminal 28. The smoothing circuit 61 smoothes phase difference represented in the form of the complex variable. The arctangent circuit 62 calculates an arctangent of the smoothed value in the form of complex variable. The dividing circuit 63 divides the arctangent by M, and outputs an estimate of frequency offset.

In operation, the CIR estimating circuit 12 (FIG. 1) inputs the decision value from the decision circuit 15, the signal received via the input terminal 11 and the estimated frequency offset, and outputs estimated CIR. The complex conjugate circuit 13 calculates a complex conjugate of the estimated CIR, and outputs a calculated complex conjugate to the multiplication circuit 14.

The multiplication circuit 14 multiplies the complex conjugate (from the complex conjugate circuit 13) and the received signal together, and provides a multiplied value to the decision circuit 15. The decision circuit 15 discriminates a decision value, i.e. an estimate of the transmitted data on the basis of the product (from the multiplication circuit 14), and outputs a signal indicative of the decision value via the decision value output terminal 17. The frequency offset estimating circuit A 16 inputs the decision value from the decision circuit 15 and the received signal via the input terminal 11, and outputs an estimate of frequency offset of the received signal to the CIR estimating circuit 12.

Operation of the frequency offset estimating circuit A 16 will be described with reference to FIG. 2. Referring to FIG. 2, the phase difference detecting circuit A 21 inputs the received signal via the input terminal 11 and the decision value via the terminal 17, and outputs the phase difference of the received signal to the phase difference smoothing circuit A 22. The smoothing circuit A 22 smoothes the phase difference, and outputs estimated frequency offset via the frequency offset output terminal 23.

Operation of the phase difference detecting circuit A21 (FIG. 2) will be described with reference to FIG. 3. The received signal phase difference detecting circuit A 31 inputs the received signal via the terminal 11, and outputs a phase difference (a complex variable indicating M-symbol-differential-detected result of the received signal) of the received signal to the multiplication circuit 34.

The decision value phase difference detecting circuit A 32 inputs the decision value signal from the decision value input terminal 17, and provides a phase difference of the decision value (a complex variable representing a phase difference in the decision value for M symbols) to the complex conjugate circuit 33. The complex conjugate circuit 33 calculates a complex conjugate of the phase difference of the decision value, thereby providing the complex conjugate to the multiplication circuit 34.

The multiplication circuit 34 multiplies the complex conjugate and the phase difference (a complex variable indicating an M-symbol-differential-detected result of the received signal in the complex variable form) of the received signal together, and outputs a product signal via the phase difference output terminal 35.

Operation of the received signal phase difference detecting circuit A 31 will be described with reference to FIG. 4. The M-symbol delay circuit 41 delays the received signal by M symbols, and outputs a delayed signal to the complex conjugate circuit 42. The complex conjugate circuit 42 calculates a complex conjugate of the delayed signal, and provides it to the multiplication circuit 34.

The multiplication circuit 34 multiplies the complex conjugate and the received signal together, and outputs, via the terminal 44, a product as a phase difference of the carrier phase in the received signal (represented in a complex variable). The decision value phase difference detecting circuit A 32 operates similarly to the received signal phase difference detecting circuit A31.

Operation of the phase difference smoothing circuit A 22 (FIG. 2) will be described with reference to FIG. 5. The arctangent circuit 15 calculates an arctangent of the phase difference represented in the complex variable, and provides the calculated arctangent to the dividing circuit 52. The dividing circuit 52 divides the arctangent by M, and outputs the quotient to the smoothing circuit 53. The smoothing circuit 53 smoothes the quotient, and outputs the smoothed value as an estimated frequency offset via the frequency offset output terminal 23.

The phase difference smoothing circuit A 22 operates in the circuit configuration shown in FIG. 6 as described below. The smoothing circuit 61 smoothes the phase differences in the form of the complex variable (received via the phase variable input terminal 35), and outputs the smoothed value to the arctangent circuit 62. The arctangent circuit 62 calculates an arctangent of the smoothed value, and outputs the arctangent to the dividing circuit 63. The dividing circuit 63 divides the arctangent value by M, and outputs divided values as estimated frequency offset via the frequency offset terminal 23.

Actual operation of the foregoing embodiment will be described hereinafter. Referring to FIG. 1, the signal expressed by formula (25) is sent as the output of the multiplication circuit 14. In this case, the received signal $r_n$ is phase-compensated according to phase of the taps $g_n$.

$$g_n^* \cdot r_n \tag{25}$$

It is assumed here that a 4-ary PSK signal arrives at the receiver. The decision circuit 15 outputs a decision value $J_n$ as $\exp(j\pi/4)$ when a product is present in the first quadrant of the complex plane. When the product is in the second quadrant, the decision circuit 15 outputs a decision value $J_n$ as $\exp(j3\pi/4)$. In the case of the third quadrant, a decision value $J_n$ is outputted as $\exp(j5\pi/4)$. In the case of the fourth quadrant, a decision value $J_n$ is outputted as $\exp(j7\pi/4)$. In the foregoing decision process, the soft decision is also applicable. In such a case, a product calculated using formula (25) will be outputted.

The CIR estimating circuit 12 estimates CIR on the basis of the decision value $J_n$ and an estimate $\Delta\omega_n$ of frequency offset (outputted from the frequency offset estimating circuit A 16). The LMS algorithm is applied here. The CIR estimating circuit 12 estimates the value of taps using the decision value $J_n$ and formula (26).

$$g_{n+1} = \{g_n + \delta(r_n - g_n \cdot J_n)J_n^*\} \exp(j\Delta\omega_n) \tag{26}$$

where the portion in brackets represents the value of taps $g_n$ updated on the basis of the LMS algorithm, and the term $\exp(j\Delta\omega_n)$ is for compensating a rotational component of a phase due to frequency offset.

Referring to FIG. 2, in the frequency offset estimating circuit A 16, the phase difference detecting circuit A 21 calculates a phase difference on the basis of the received signal $r_n$ and the decision value $J_n$ and using formula (27). The phase difference is present between a span of M symbols, and is represented by the complex variable.

$$\Delta W'_n = (J_n \cdot J_{n-m}^*) \cdot r_n \cdot r_{n-m}^* \tag{27}$$

When configured as shown in FIG. 5, the phase difference smoothing circuit A 22 calculates frequency offset on the basis of the phase difference $\Delta \omega_n$ (received from the phase difference detecting circuit A 21) and using formula (28). Further, if configured as shown in FIG. 6, the phase difference smoothing circuit A 22 calculates frequency offset using formulas (29) and (30).

$$\Delta \omega_{n+1} = (1-\alpha)\Delta \omega_n + \alpha \arctan (\Delta W'_n)/M \tag{28}$$

$$\Delta W_{n+1} = (1-\alpha)\Delta W_n + \alpha \Delta W'_n \tag{29}$$

$$\Delta \omega_{n+1} = \arctan (\Delta W_{n+1})/M \tag{30}$$

Formula (28) can be replaced by formula (31), and formula (29) can be replaced by formula (32).

$$\Delta \omega_{n+1} = \sum_{i=1}^{K} \arctan (\Delta W'_{n-i+1})/(M \cdot K) \tag{31}$$

$$\Delta \omega_{n+1} = \sum_{i=1}^{K} \Delta W'_{n-i+1} \tag{32}$$

where $\alpha$ and K are values relevant to time constants of the smoothing circuit 53 or 61.

The circuit configurations shown in FIGS. 5 and 6 are different from each other in the order in which the smoothing and the arctangent calculation are carried out. When the smoothing is performed in the complex plane prior to the arctangent calculation as shown in FIG. 6, phase jumping can be prevented. On the other hand, if the smoothing is performed after the arctangent calculation, the circuit configuration can be simplified. Further, if the arctangent calculation is coarse, it is possible to reduce rounding error caused by the arctangent calculation.

In the frequency offset estimation, the procedure for deriving a phase difference per symbol on the basis of the phase difference for M symbols is also effective to the smoothing process which can suppress a fluctuation of phase due to noise. Therefore, the smoothing circuit 53 or 61 can have a relatively large time constant. This allows precise and rapid estimation of frequency offset.

An influence of incorrect decision of a received signal during the frequency offset estimation can be suppressed to 1/M in the frequency offset estimation which is performed on the basis of the phase variation per symbol. Therefore, the receiver can operate reliably in a low C/N situation where incorrect decision of the received signal occurs frequently.

In the present invention, the received signal is compensated depending upon estimated CIR therefor. A signal indicative of received data, which are estimated on the basis of the compensated signal and serve as the decision value, is outputted. Frequency offset is estimated on the basis of a decision value, a decision value of a received signal delayed by M symbols, the received signal, and the received signal delayed by M symbols. Then, CIR are estimated on the basis of the frequency offset, decision value, and received signal. The complex conjugate of the CIR and the received signal are multiplied so as to eliminate a phase rotation due to the frequency offset.

The LMS algorithm is used to estimate the CIR in the foregoing description. Alternatively, the adaptive algorithms including the RLS algorithms is applicable to such estimation. Even when CIR varies rapidly, it can track the variation of CIR using the adaptive algorithm.

The decision value is used to calculate the phase difference in the foregoing description. The phase difference can also be calculated using known information about the received signal in place of the decision value. Further, a table, in which an output signal of the decision value phase difference detecting circuit A 32 is stored when the known information about the received signal is available, can be used in place of the decision value phase difference detecting circuit A 32.

The bit error rate of a succeeding Viterbi decoder can be improved by outputting a soft-decision value via the decision value output terminal 17.

Embodiment 2

Figure 7:
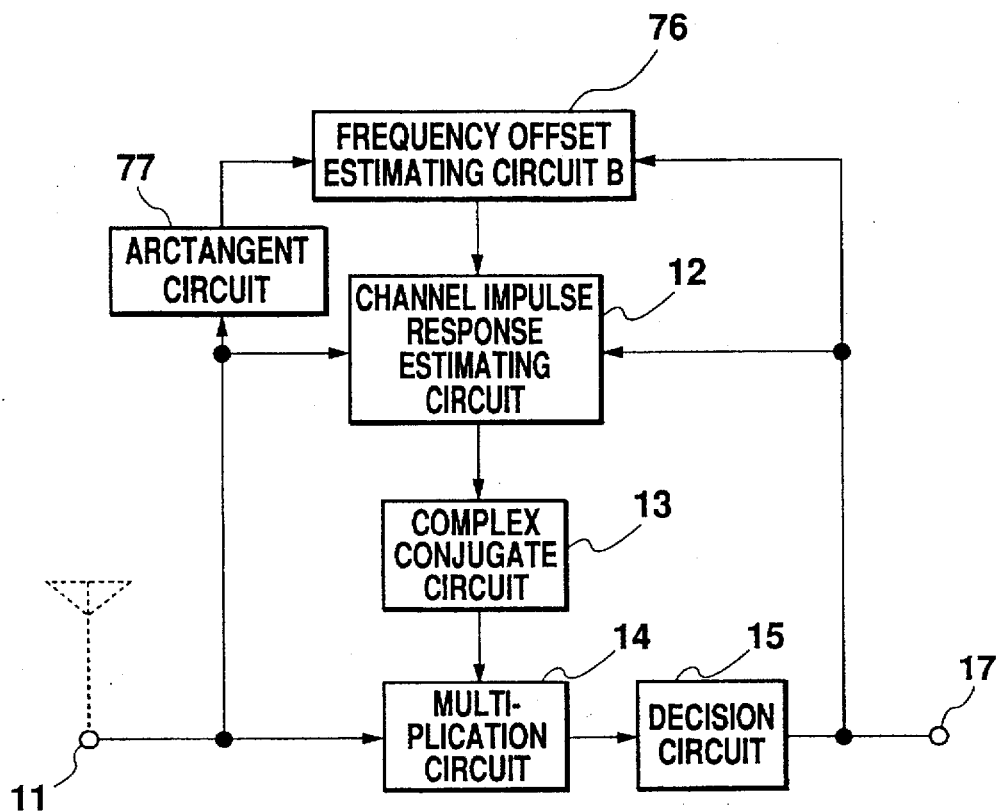
FIG. 7 shows the configuration of a receiver with the AFC function according to a second embodiment.

In a second embodiment, a receiver with the AFC function has the configuration as shown in FIG. 7. This embodiment differs from the first embodiment in the estimation of frequency offset, which will be mainly described hereinafter.

In FIG. 7, reference numeral 77 denotes an arctangent circuit for calculating an arctangent for a signal received via the input terminal 11, and 76 a frequency offset estimating circuit B for outputting a signal, indicative of frequency offset on the basis of the received signal, via the input terminal 11.

Figure 8:
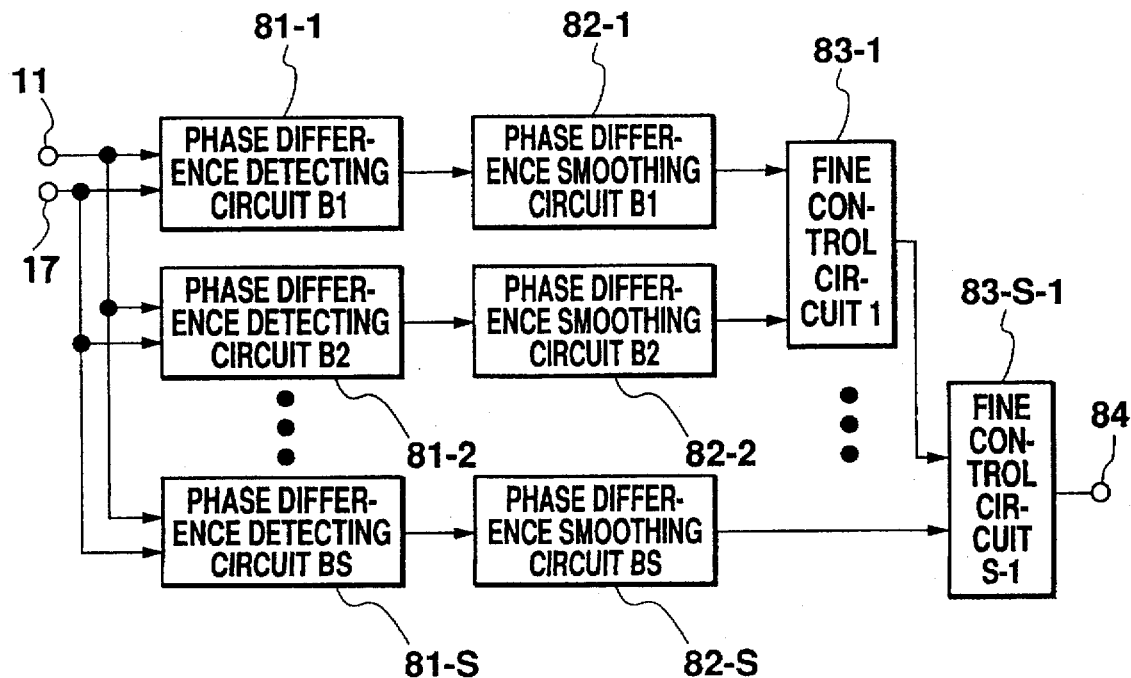
FIG. 8 shows the configuration of a frequency offset estimating circuit B in the receiver shown in FIG. 7.

The frequency offset estimating circuit B 76 includes phase difference detecting circuits B1–BS (81-1–81-S), phase difference smoothing circuits B1–BS (82-1–82-S), a fine control circuit 1 (83-1), and a fine control circuit 2 to a fine control circuit S-1 (83-2 through 83-S-1). In FIG. 8, reference numeral 11 denotes the received signal input terminal, 17 the decision value input terminal, and 84 a frequency offset output terminal. The phase difference detecting circuits B1–BS (81-1–81-S) input the received signals via the input terminal 11 and the decision values via the decision value input terminal 17, calculate phase differences between spans of $M_1, M_2, \ldots M_s$ symbols, and provide phase differences to the phase difference smoothing circuits B1–BS (82-1–82-S). The phase difference smoothing circuits B1–BS (82-1–82-S) smooth the phase differences from the phase difference detecting circuits B1–BS (81-1–81-S). The fine control circuit 1 (83-1) inputs estimated frequency offsets from the phase difference detecting circuit B1 (82-1) and estimated frequency offset from the phase difference smoothing circuit B2 (82-2), and fine-controls the frequency offset. The fine control circuit 2 through fine control circuit S-1 (83-2–83-S-1) receive an estimate of frequency offset from the phase difference smoothing circuit B3–BS (82-3–82-S) and estimated frequency offsets from the fine control circuit 1 through fine control circuit S-2 (83-1–83-S-2), and fine-control the frequency offsets.

The phase difference detecting circuit B1 (81-1) of FIG. 8 includes a received signal phase difference detecting circuit B1 (91-1), a decision value phase difference detecting circuit B1 (92-1), and a subtracting circuit 93-1. Reference numeral 11 denotes the received signal input terminal, 17 the decision value input terminal, and 94-1 a phase difference output terminal. The received signal phase difference detecting circuit B1 (91-1) inputs the received signal via the input terminal 11, and detects a phase difference for the $M_1$ symbols in the received signal. The decision value phase difference detecting circuit B1 (92-1) receives the decision value from the decision value input terminal 17, and detects a phase difference for the $M_1$ symbols in the decision value. The subtracting circuit 93-1 receives the phase difference of the received signal from the phase difference detecting circuit B1 (91-1) and the phase difference of the decision value from the phase difference detecting circuit B1 (92-1), and subtracts the phase difference of the decision value from the phase difference of the received signal. In the configuration shown in FIG. 9, the symbols $M_2, \ldots M_s$ are used instead of symbol $M_1$.

Figure 10:
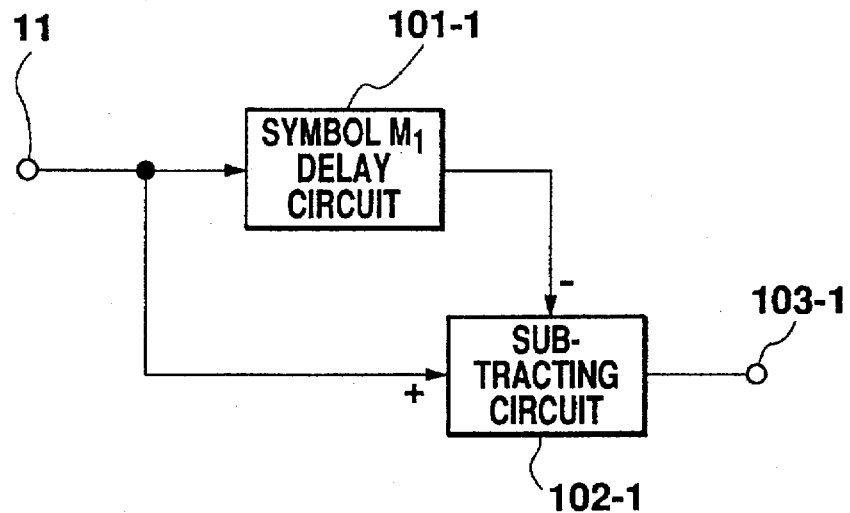
FIG. 10 shows an example of the configuration of a received signal phase difference detecting circuit B1 in the phase difference detecting circuit B of FIG. 9.

Referring to FIG. 10, the received signal phase difference detecting circuit B1 (91-1) Includes an $M_1$-symbol delay circuit 101-1, and a subtracting circuit 102-1. In FIG. 10, reference numeral 11 denotes the received signal input terminal, and 103-1 a received signal phase difference output terminal. The $M_1$-symbol delay circuit 101-1 delays the received signal (via the terminal 11) by the $M_1$ symbols. The subtracting circuit 102-1 subtracts the delayed signal (output from the $M_1$-symbol delay circuit 101-1) from the received signal (via the terminal 11). Further, the received signal phase difference detecting circuits B2–BS (91-2–91-S) have the configuration similar to that described above. The symbols $M_2, \ldots M_s$ are used in place of the symbol $M_1$. The decision value phase difference detecting circuits B1–BS (92-1–92-S) are configured similarly to those described above.

Figure 11:
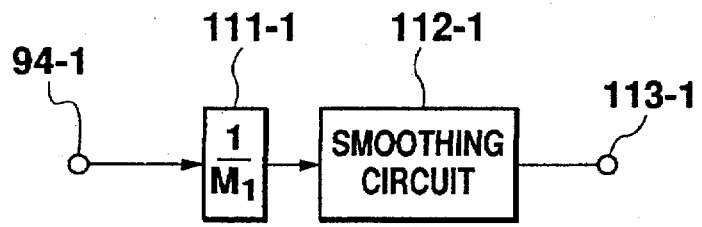
FIG. 11 shows an example of the configuration of a phase difference smoothing circuit in the frequency offset estimating circuit B shown in FIG. 8.

Referring to FIG. 11, the phase difference smoothing circuit B1 (82-1) includes a dividing circuit 111-1, and a smoothing circuit 112-1. Reference numeral 94-1 denotes a phase difference input terminal, and 113-1 a frequency offset output terminal. The dividing circuit 111-1 divides the phase difference (received via the terminal 94-1) by $M_1$. The smoothing circuit 112-1 smoothes the quotient (from the subtracting circuit 111-1). The phase difference smoothing circuits B2–BS (82-2–82-S) have the same configuration as that described above. For these circuits, the symbols $M_2, \ldots M_s$ are used in place of the symbol $M_1$.

Figure 12:
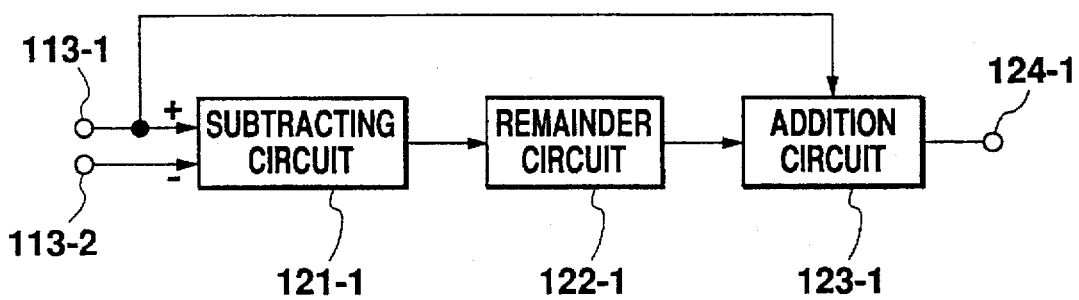
FIG. 12 shows an example of the configuration of a fine control circuit in the frequency offset estimating circuit B shown in FIG. 8.

Referring to FIG. 12, the fine control circuit 1 (83-1) includes a frequency offset input terminal A (113-1), a frequency offset input terminal B (113-2), a subtracting circuit 121-1, a remainder circuit 122-1, an addition circuit 123-1, and a frequency offset output terminal 124-1. An output signal of the phase difference smoothing circuit B1 is received via the terminal A 113-1. An output signal of the phase difference smoothing circuit is received via the terminal B 113-2. The subtracting circuit 121-1 calculates a difference between two frequency offsets received via the terminals A (113-1) and B (113-B). The remainder circuit 122-1 calculates a remainder of the difference from the subtracting circuit 121-1. The addition circuit 123-1 adds the frequency offset from the input terminal A (113-1) and the remainder from the remainder circuit 1 (122-1). The fine control circuits 2-S-1 (83-2–83-S-1) are configured as described above.

The receiver of this embodiment operates in the following manner. Parts which are Identical to those in the first embodiment are assigned identical reference numerals, and are not described here in detail. This embodiment differs from the foregoing embodiment in the estimation of frequency offset, which will be described hereinafter.

Operation of the frequency offset estimating circuit B (76) will be described with reference to FIG. 8. The phase difference detecting circuits B1–BS (81-1–81-S) output decision values via the input terminal 11, detect phase differences between span of $M_1, M_2, \ldots M_s$ symbols, and output the phase differences to the phase difference smoothing circuits B1–BS (82-1–82-S).

The phase difference smoothing circuits B1–BS (82-1–82-S) input a phase difference from the phase difference detecting circuits B1–BS (81-1–81-S) respectively, smooth the phase differences, and output signals, each of which is indicative of a phase difference per symbol as estimated frequency offset, to the fine control circuits 1-S-1 (83-1–83-S). Inputting two kinds of frequency offsets, the fine control circuits 1-S-1 (83-1–83-S-1) control the frequency offsets precisely and extensively, and output a signal indicative of a fine-controlled frequency offset.

Figure 9:
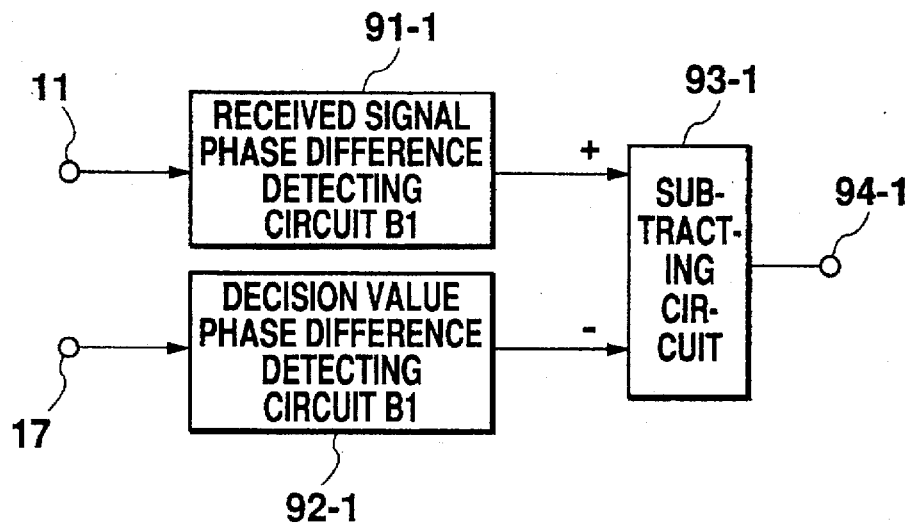
FIG. 9 shows an example of the configuration of a phase difference detecting circuit B1 in the frequency offset estimating circuit B of FIG. 8.

In the circuit configuration shown in FIG. 9, the phase difference detecting circuit B1 (81-1) operates as follows. As shown in FIG. 9, the received signal phase difference detecting circuit B1 (91-1) detects phase difference between span of $M_1$ symbols of the signal received via the input terminal 11. The decision value phase difference detecting circuit B1 (92-1) detects phase differences between span of $M_1$ symbols of the decision value (received via the input terminal 17).

The subtracting circuit 93-1 subtracts the phase difference (from the decision value phase difference detecting circuit B1 (92-1)) from the phase difference (from the received signal phase difference detecting circuit B1 (91-1)), and outputs the phase difference via the phase difference output terminal 94-1. The received signal phase difference detecting circuits B2–BS (89-1–89-S) operate in a similar manner.

Operation of the received signal phase difference detecting circuit B1 (91-1) will be described with reference to the configuration shown in FIG. 10. The $M_1$-symbol delay circuit 101 delays the received signal (via the input terminal 11) by the symbol $M_1$, and outputs the delayed signal to the subtraction circuit 102-1. The subtraction circuit 102-1 subtracts the delayed signal from the received signal (via the input terminal), and outputs the difference via the received signal phase difference output circuit 103-1. The received signal phase difference detecting circuits B2–BS (91-2-91-S) operate similarly to the received signal phase difference detecting circuit B1(91-1). The symbols $M_2, \ldots M_s$ are used for these circuits.

Operation of the phase difference smoothing circuit B1 (82-1) of FIG. 8 will be described with reference to the configuration shown in FIG. 11. The dividing circuit 111-1 divides the phase difference (received via a phase difference input terminal 94-1) by $M_1$, and outputs divided values to an smoothing circuit 112-1. The smoothing circuit 112-1 smoothes the values, thereby outputting a smoothed value via a frequency offset output terminal 113-1. The phase difference smoothing circuits B2–BS (82-2–82-S) operate in a similar manner to that described above. For these circuits, $M_2, M_3, \ldots M_s$ symbols are used instead of the symbol $M_1$.

The fine control circuit 1 (83-1) of FIG. 8 operates as follows in the circuit configuration shown in FIG. 12. The subtracting circuit 121-1 subtracts the frequency offset (via the frequency offset input terminal B (13-2)) from the frequency offset (via the frequency offset input terminal A (13-1)), and outputs a subtracted result, to the remainder circuit (122-1). The remainder circuit (122-1) calculates a remainder for $2\pi/M_2$, and outputs the remainder, which is within $[-\pi/M_2, \pi/M_2)$.

The addition circuit 123-1 adds the frequency offset (from the frequency offset input terminal A (113-1)) and the remainder (from the remainder circuit 1 (122-1)), and outputs a sumation as a frequency offset. The fine control circuits 2-S-1 (83-2–83-S-1) operate in a similar manner to that described above. The symbols $M_3, M_4, \ldots M_s$ are used for these circuits instead of the symbols $M_2$.

Operation of the second embodiment will be quantitatively described hereinafter. For simplification, it is assumed that S=2 and $M_1 > M_2$. In the configuration shown in FIG. 8, output signals of the phase difference detecting circuits B1 (81-1) and B2 (81-2) are respectively expressed by formulas (33) and (34).

$$\Delta\omega'(1)_n = (\gamma_n - \gamma_{n-M1}) - (\Theta_n - \Theta_{n-M1}) \tag{33}$$

$$\Delta\omega'(2)_n = (\gamma_n - \gamma_{n-M2}) - (\Theta_n - \Theta_{n-M2}) \tag{34}$$

where $\Theta_n$ is a phase of a transmitted signal at time n, and $\gamma_n$ is a phase of the received signal.

The phase difference smoothing circuits B1 and B2 (82-1, 82-2) divide $\Delta\omega'(1)_n$ and $\Delta\omega'(2)_n$ by $M_1$ and $M_2$ (i.e. $1/M_1$, $1/M_2$), respectively, and smooth them so as to suppress fluctuations of phase difference. These processes are expressed by formulas (35) and (36).

$$\Delta\omega(1)_{n+1}=(1-\alpha)\Delta\omega(1)_n+\alpha\Delta\omega'(1)_n/M_1 \qquad (35)$$

$$\Delta\omega(2)_{n+1}=(1-\alpha)\Delta\omega(2)_n+\alpha\Delta\omega'(2)_n/M_2 \qquad (36)$$

Formulas (35) and (36) are equivalent even when the order of the subtraction and smoothing processes is reversed. In these formulas, $\Delta\omega(1)_n$ and $\Delta\omega(2)_n$ represent the estimated frequency offsets outputted by the phase difference smoothing circuits B1 and B2 (82-1, 82-2). The formulas (35) and (36) can be replaced with formulas (37) and (38).

$$\Delta\omega(1)_{n+1} = \sum_{i=1}^{K} \Delta\omega'(1)_{n-i+1} /(M_1 \cdot K) \qquad (37)$$

$$\Delta\omega(2)_{n+1} = \sum_{i=1}^{K} \Delta\omega'(2)_{n-i+1}/(M_2 \cdot K) \qquad (38)$$

where $\alpha$ and K correspond to time constants of the smoothing circuits 112-1 and 112-2. Different time constants may be used for the phase difference smoothing circuits B1–BS (82-1–82-S).

The fine control circuit 1 (83-1) calculates frequency offset $\Delta\omega_n$ on the basis of the estimated frequency offsets $\Delta\omega(1)_n$ and $\Delta\omega(2)_n$ using formula (39).

$$\Delta\omega_n=\text{MOD}(\Delta\omega(1)_n-\Delta\omega(2)_n, 2\pi/M_2)+\Delta\omega(1)_n$$

$$\text{MOD}(x, y)=\text{mod}(x+y/2, y)-y/2 \qquad (39)$$

where mod(x, y) denotes calculation of a remainder (modulo), and MOD(x, y) denotes calculation of a remainder (modulo) in which a remainder is set to be within [−y/2, y/2).

Figure 19:
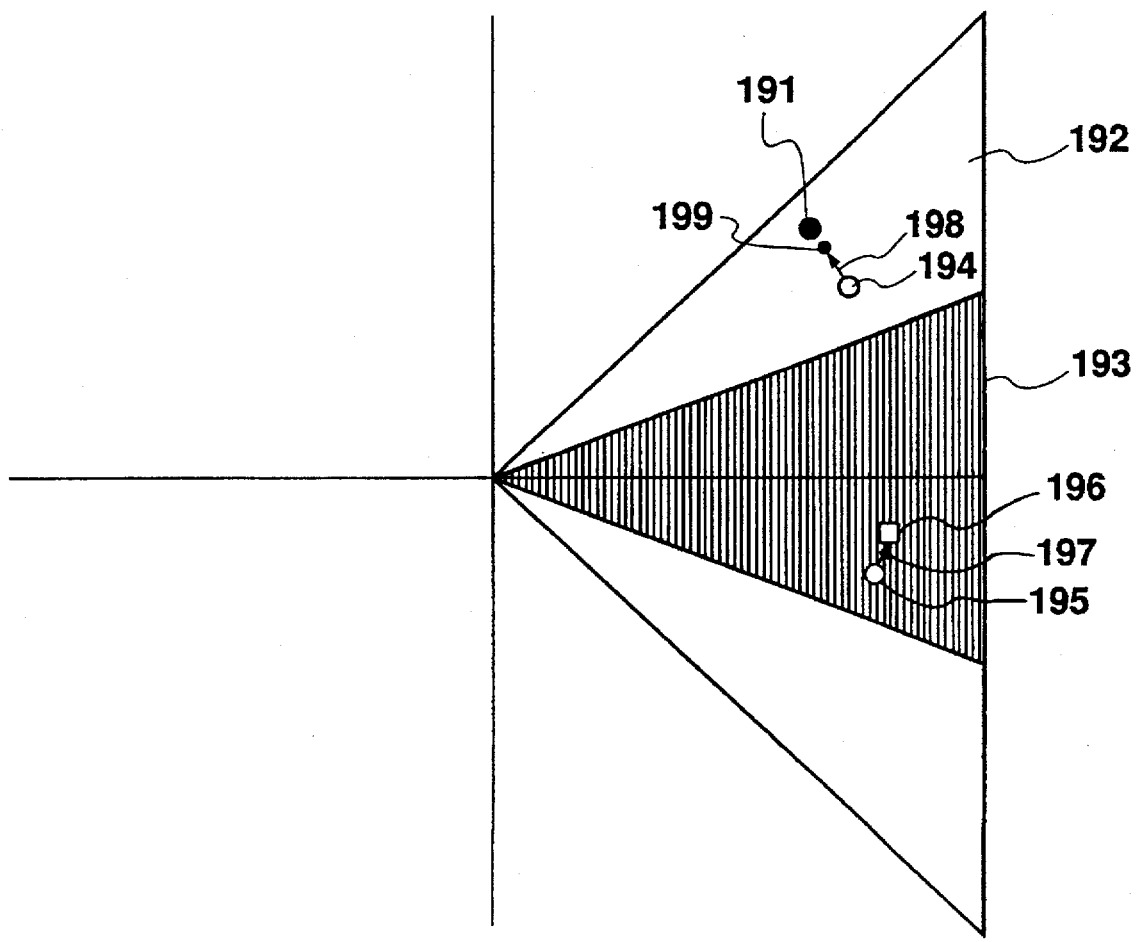
FIG. 19 shows the principle of a fine control circuit.
Figure 20:
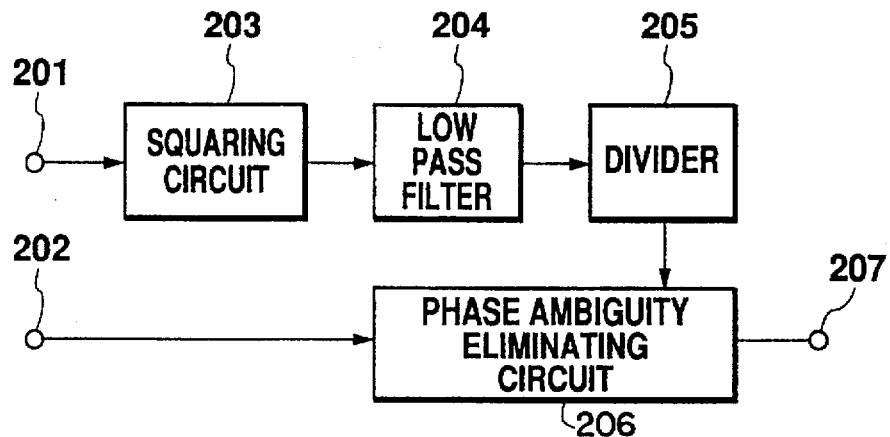
FIG. 20 shows the configuration of a carrier phase synchronizing circuit of the prior art.
Figure 21:
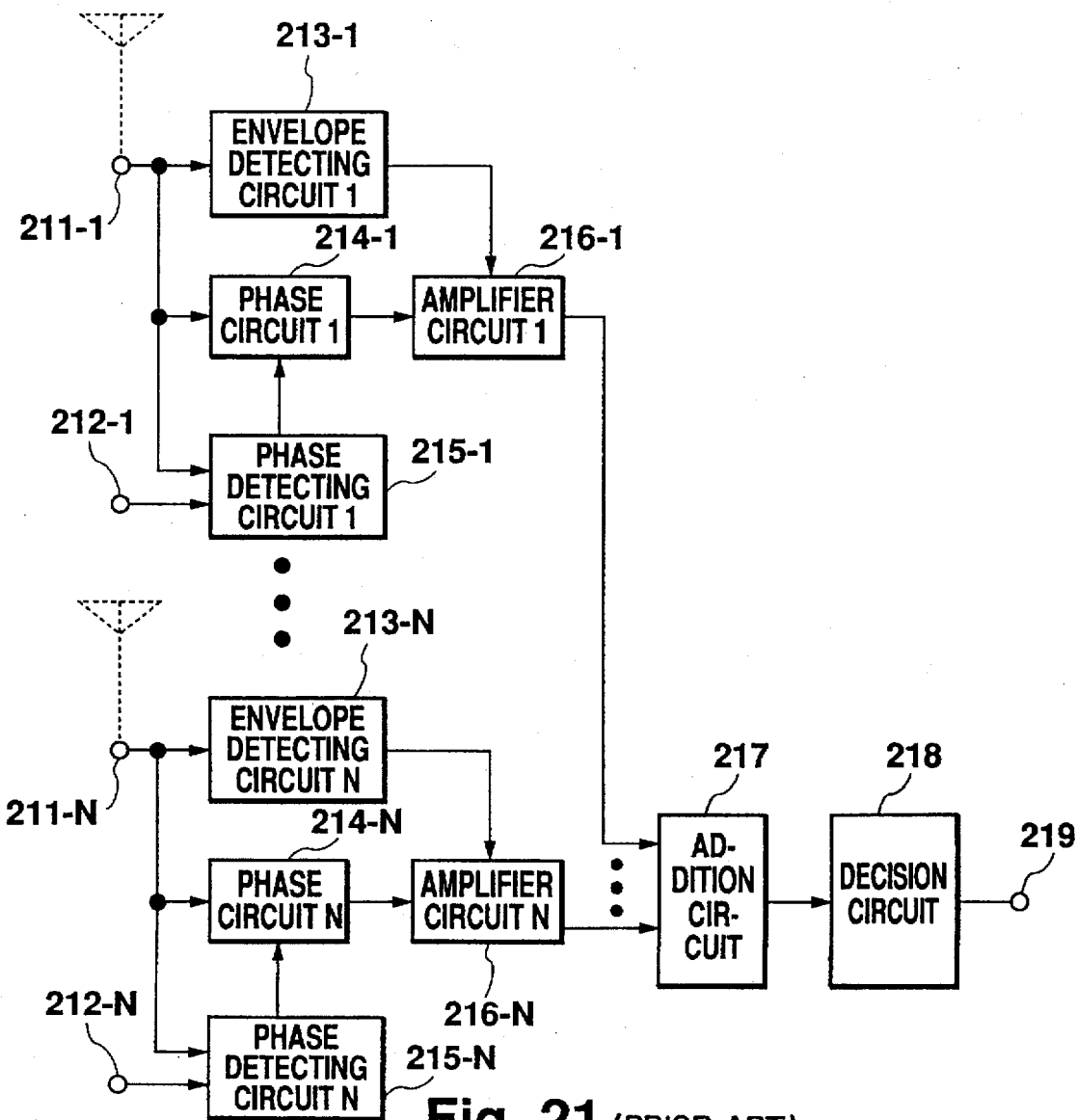
FIG. 21 shows the configuration of a diversity receiver of the prior art.
Figure 22:
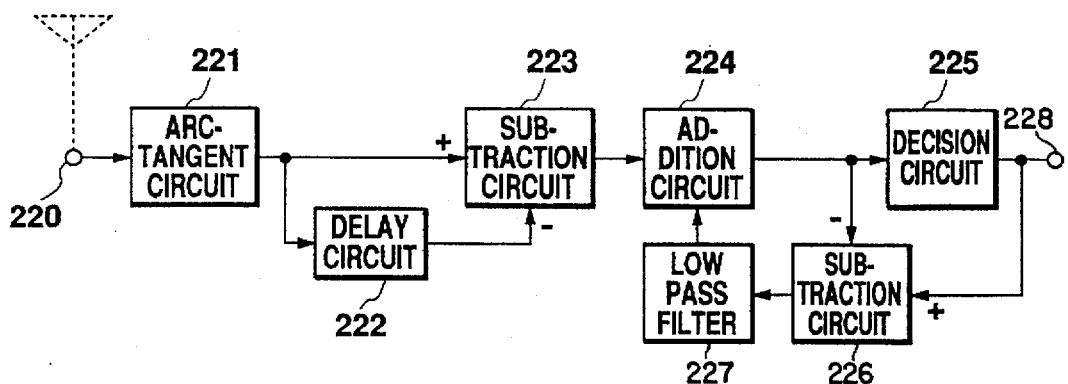
FIG. 22 shows the configuration of a receiver with the AFC function in the first example of the prior art.
Figure 23:
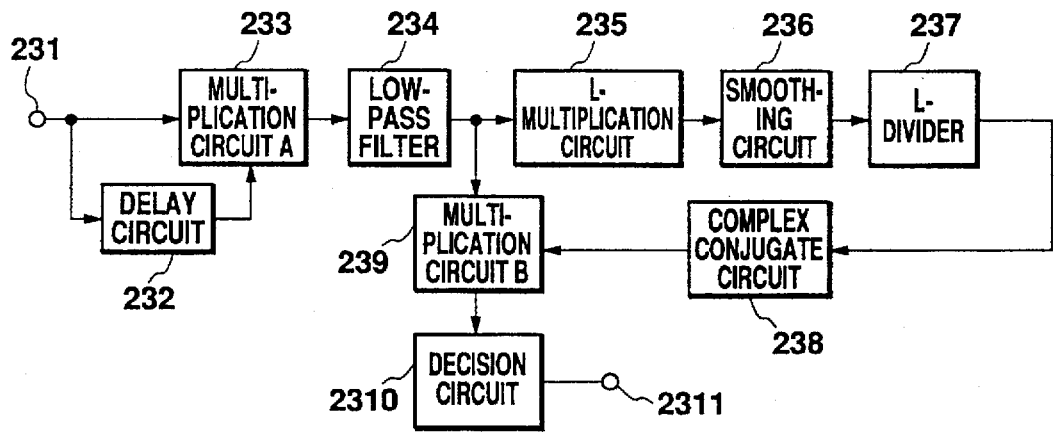
FIG. 23 shows the configuration of a receiver with the AFC function in the second example of the prior art.
Figure 24:
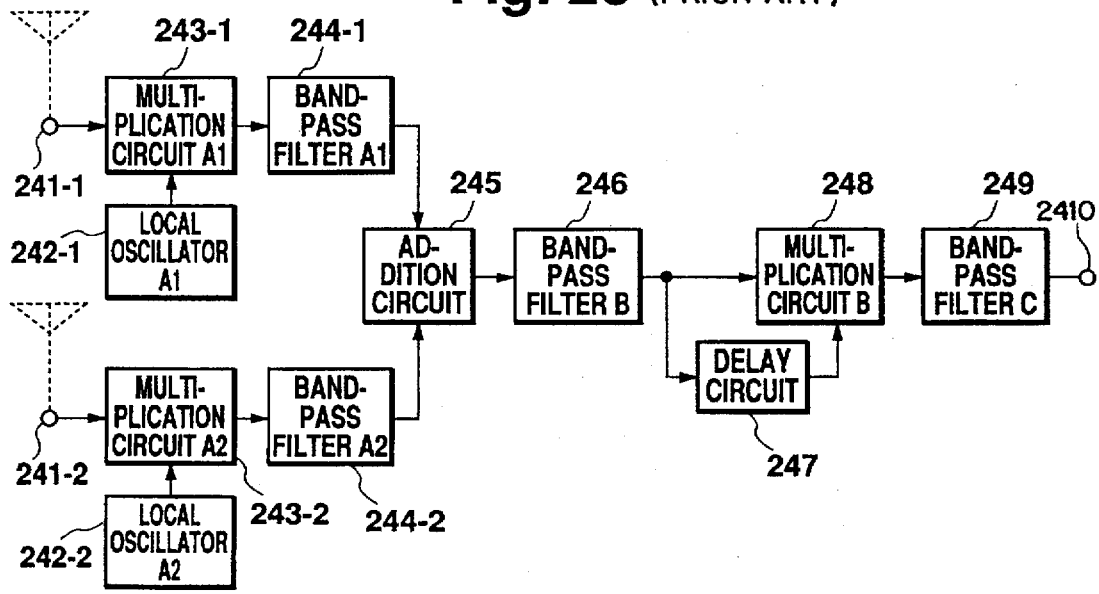
FIG. 24 shows the configuration of a diversity receiver of the third example of the prior art.

FIG. 19 shows the principle of the process expressed by the formula (39). In FIG. 19, reference numeral 191 denotes an actual frequency offset (unknown at the receiving side). 192 an estimated range ($M_1$=4) of the frequency offset $\Delta\omega(1)_n$, 193 an estimated range ($M_2$=8) of the frequency offset $\Delta\omega(2)_n$, 194 the estimated frequency offset $\Delta\omega(1)_n$, 195 a point where $\Delta\omega(1)_n$ is projected into the estimated range of $\Delta\omega(2)_n$, 196 the estimated frequency offset $\Delta\omega(2)_n$, 197 a difference between the point, where $\Delta\omega(1)_n$ is projected into the estimated range of $\Delta\omega(2)_n$, and $\Delta\omega(2)_n$, 198 a fine-controlled component of the frequency offset $\Delta\omega(1)_n$, and 199 a fine-controlled result.

When estimating the frequency offset, the larger $M_1$, the more extensively fluctuations of the phase difference due to noise are suppressed. Thus, the phase difference can be detected more precisely, and influences caused by incorrect decision will be reduced to $1/M_1$. However, since an estimated range of the frequency offset is $[-\pi/M_1, \pi/M_1)$, it will be narrowed in inverse proportion to $M_1$.

The fine control circuit (83-1) calculates a remainder of a difference between the estimated frequency offset $\Delta\omega(1)_n$ (having a relatively wide range) and the estimated frequency offset $\Delta\omega(2)_n$ (having a relatively high precision), detects a point where $\Delta\omega(1)_n$ is projected into the estimated range of $\Delta\omega(2)_n$ and the difference 197 of $\Delta\omega(2)_n$, and fine-controls $\Delta\omega(1)_n$ according to the difference 197. Thus, a frequency offset approximate to the actual frequency offset (199) will be estimated.

With the second embodiment, a plurality of frequency offsets having different levels of precision and different ranges are concurrently estimated, so that the frequency offsets can be estimated precisely and over a wide range. CIR are compensated on the basis of the estimated frequency offset. A complex conjugate of the compensated CIR is multiplied by the received signal. Thus, it is possible to eliminate frequency offset precisely and extensively.

In the foregoing description, the same time constant is applied to the phase difference smoothing circuits B1–BS (82-1–82-S). Different time constants may be used for these circuits.

As described so far, a plurality of frequency offsets having different levels of estimation precision and different estimation ranges are estimated in parallel, and are fine-controlled. Alternatively, they can be estimated and fine-controlled in a sequential manner.

The frequency offset estimating circuit estimates frequency offsets only on the basis of the phase in this embodiment. Further, the frequency offset estimating circuit can estimate frequency offset on the basis of a complex variable as in the first embodiment. Conversely, the frequency offset estimation in the first embodiment can be performed based only on the phase.

The LMS algorithm is applied to estimate CIR in the foregoing description. Alternatively, the adaptive algorithms including the RLS algorithm may be used to recursively estimate CIR. If CIR vary very rapidly, they can be estimated accordingly.

The decision value is used to calculate the phase difference in the foregoing description. The phase difference can be also calculated using known information about the received signal in place of the decision value. Further, a table, in which output signals of the decision value phase difference detecting circuits B1–BS (92-1–92-S) are stored when the known information about the received signal is available, can be used in place of the decision value phase difference detecting circuits B1–BS (92-1–92-S).

The bit error rate of a succeeding Viterbi decoder can be improved by outputting a soft-decision value via the decision value output terminal 17.

Embodiment 3

Figure 13:
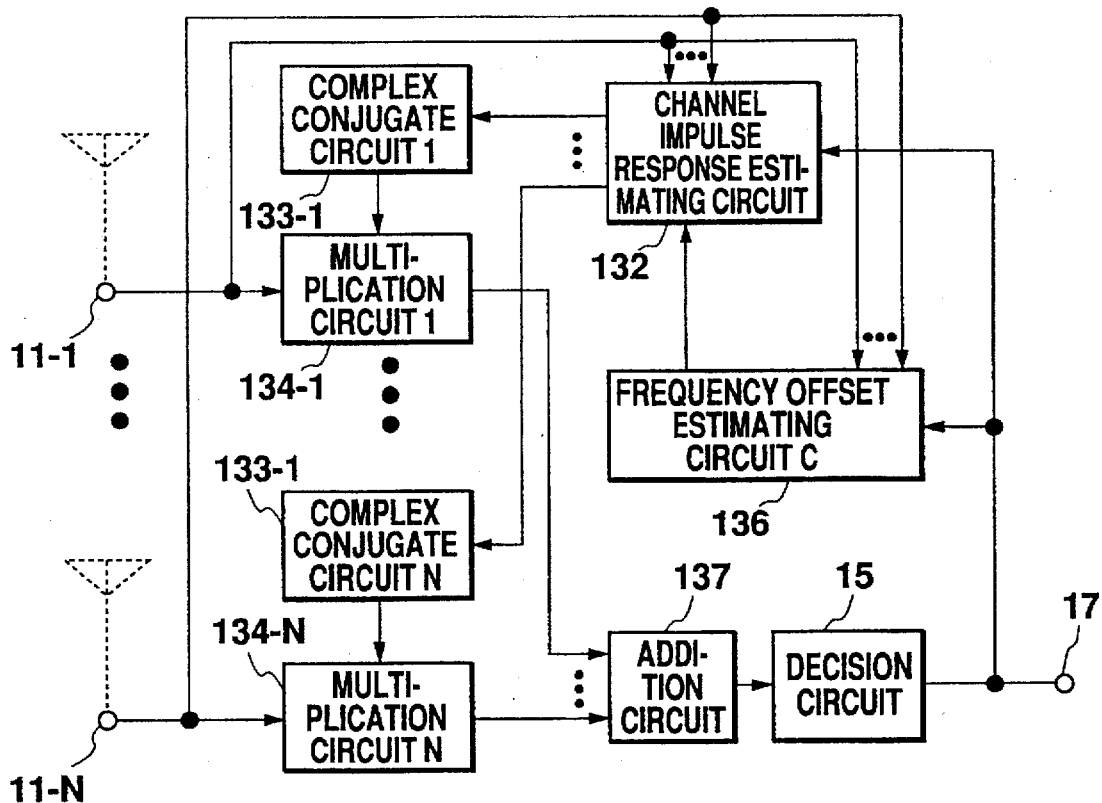
FIG. 13 shows the configuration of a receiver with the AFC function according to a third embodiment.

A third embodiment of the invention will be described with reference to FIG. 13 showing the configuration of a receiver with the AFC function. Parts which are identical to those in the first embodiment are assigned identical reference numerals, and are not described here in detail.

The receiver comprises received signal input terminals 11-1–11-N, complex conjugate circuits 133-1–133-N, multiplication circuits 134-1–134-N, an addition circuit 137, a decision circuit 15, a frequency offset estimating circuit C (136), and a CIR estimating circuit 132. The complex conjugate circuits 133-1–133-N calculate complex conjugates. The multiplication circuits 134-1–134-N multiply the complex conjugates (from the complex conjugate circuits 133-1–133-N) and the received signals (via the input terminals 11-1–11-N) together. The addition circuit 137 adds the multiplied values (from the multiplication circuits 134-1–134-N). The decision circuit 15 outputs a decision value, i.e. an estimated value of the transmitted data, on the basis of the sumation from the addition circuit 137. The frequency offset estimating circuit C 136 estimates a frequency offset on the basis of the decision value, and the signals received via the terminals 11-1–11-N. The CIR estimating circuit 132 estimates CIR on the basis of the decision value, the frequency offset (output by the frequency offset estimating circuit C 136) and the received signals via terminals 11-1–11-N.

Figure 14:
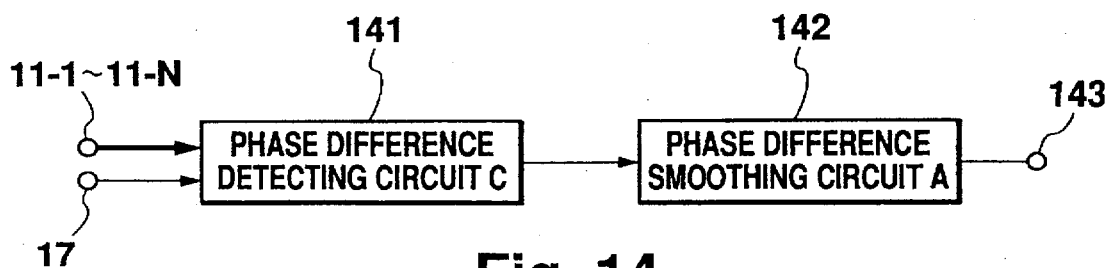
FIG. 14 shows the configuration of a frequency offset estimating circuit C in the receiver shown in FIG. 13.

The frequency offset estimating circuit C 136 of FIG. 13 is configured as shown in FIG. 14. In FIG. 14, reference numerals denote the following: 11-1–11-N received signal input terminals; 17 a decision value input terminal; 141 a phase difference detecting circuit C; 142 a phase difference smoothing circuit A, and 143 a frequency offset output terminal. Specifically, the phase difference detecting circuit C 141 detects, on the basis of N received signals (via the terminals 11-1–11-N) and a decision value (via the terminal 17), phase differences between a span of M symbols in a signal into which the received signals are combined. The phase difference smoothing circuit A 142 smoothes the phase differences (from the phase difference detecting circuit C 141). Reference numeral 143 denotes a frequency offset output terminal.

Figure 15:
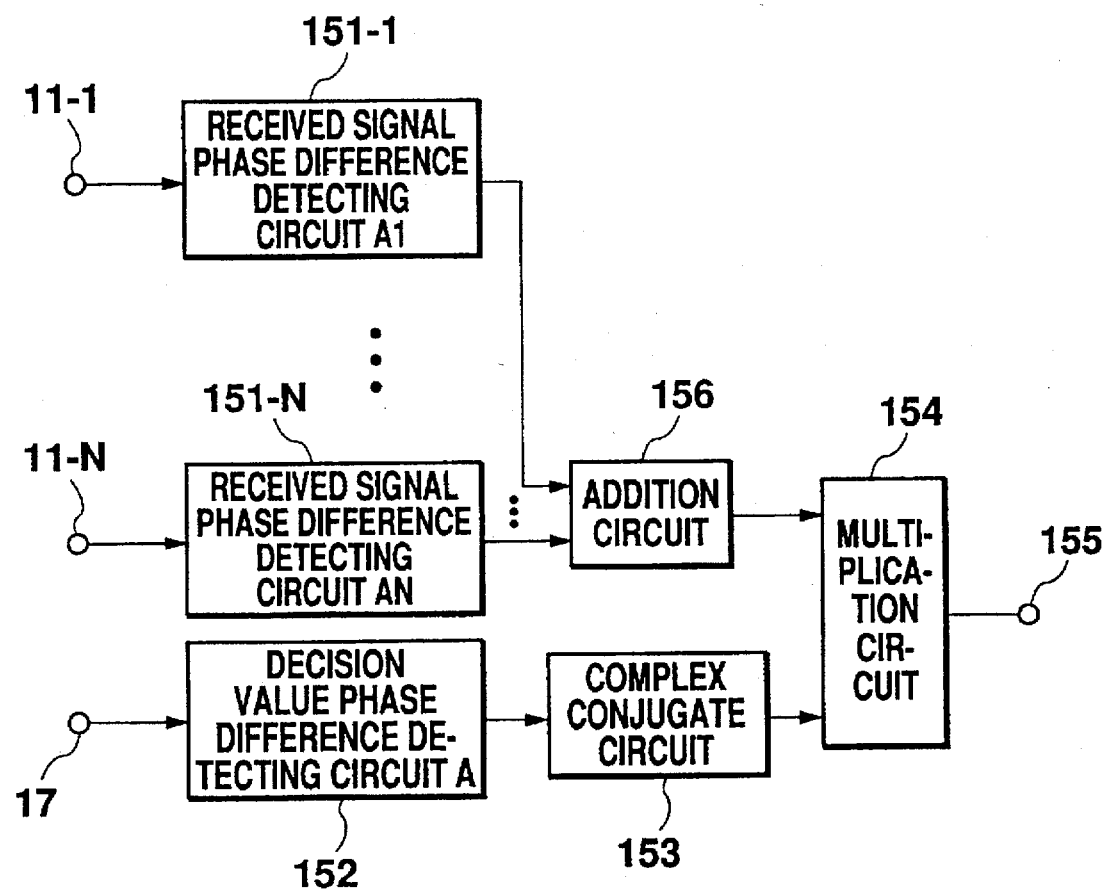
FIG. 15 shows the configuration of a phase difference detecting circuit C in the frequency offset estimating circuit C shown in FIG. 14.

The phase difference detecting circuit C 141 of FIG. 14 is configured as shown in FIG. 15. Referring to FIG. 15, reference numerals denote the following: 11-1–11-N received signal input terminals; 17 a decision value input terminal; 151-1–151-N received signal phase difference detecting circuits A1–AN; 156 an addition circuit; 152 a decision value phase difference detecting circuit A; 153 a complex conjugate circuit; 154 a multiplication circuit; and 155 a phase difference output terminal. The received signal phase difference detecting circuits A1–AN (151-1–151-N) detect phase differences (complex variables indicating M-symbol-delayed result of the received signal in the complex variables) in N signals received via the input terminals 11-1–11-N. The addition circuit 156 adds the phase differences of the N received signals (from the received signal phase difference detecting circuits A1–AN (151-1–151-N)). The decision value phase difference detecting circuit A (152) detects a phase difference in the decision value (via the input terminal 17). The complex conjugate circuit 153 outputs a complex conjugate of the phase difference (a complex variable representing a phase difference in the decision value for M symbols) from the decision value phase difference detecting circuit A (152). The multiplication circuit 154 multiplies the sumation (from the addition circuit 156) and the complex conjugate (from the complex conjugate circuit 153) together.

The receiver of this embodiment operates in the following manner. Parts which are identical to those in the first embodiment are assigned identical reference numerals, and are not described here in detail. This embodiment differs from the first embodiment in that CIRs for N received signals are estimated using decision values obtained by deciding diversity-combined signals, and that frequency offset are estimated on the basis of the decision value N received signals. These differences will be specifically described.

Referring to FIG. 13, the complex conjugate circuits 133-1–133-N input CIRs of N received signals from the CIR estimating circuit 132, and output complex conjugates of the CIRs. The multiplication circuits 134-1–134-N multiply the complex conjugates (from the complex conjugate circuits 133-1–133-N) and the received signals (via the input terminals 11-1–11-N).

The addition circuit 137 adds N products (from the multiplication circuits 133-1–133-N). The decision circuit 15 discriminates a decision value on the basis of the added result, and outputs the decision value as an estimated value. The frequency offset estimating circuit C (136) receives the decision value (from the decision circuit 15) and N received signals (via the input terminals 11-1–11N), and outputs estimated frequency offsets.

The CIR estimating circuit 132 receives the decision value and N received signals, estimates N CIRs, and outputs N estimated CIRs.

The frequency offset estimating circuit C (136) operates as follows in the circuit configuration shown in FIG. 14. Referring to FIG. 14, the phase difference detecting circuit C (141) inputs the received signals via the signal input terminals 11-1–11-N and the decision value via the decision value input terminal 17, and outputs phase differences between a span of M symbols. The phase difference smoothing circuit A (142) smoothes the phase difference so as to obtain a phase difference for a symbol, and outputs signals, which are indicative of the calculated phase difference as an estimated frequency offset, via the frequency offset output terminal 143.

The phase difference detecting circuit C (141) of FIG. 14 operates as follows in the circuit configuration shown in FIG. 15. The received signal phase difference detecting circuits A1–AN (151-1–151-N) input the received signals via the input terminals 11-1–11-N, and output phase differences (complex variables indicative of M-symbol-differential detected results of the received signals represented by the complex variable) of these signals.

The addition circuit 156 adds the phase differences of N received signals (complex variable indicating M-symbol differential detected results of the received signal in the complex variable form) from the received signal phase difference detecting circuits A1–AN (151-1–151-N), and outputs the sumation.

The decision value phase difference detecting circuit A (152) receives the decision values (received via the decision value input terminal 17), detects phase differences (a complex variable representing a phase difference in the decision value for M symbols), and outputs the phase differences to the complex conjugate circuit 153.

The complex conjugate circuit 153 calculates a complex conjugate of the phase difference from the decision value phase difference detecting circuit A (152), and outputs the calculated complex conjugate.

The multiplication circuit 154 multiplies the complex conjugate (from the complex conjugate circuit 153) and the sumation (from the addition circuit 156) together, and outputs a phase difference via the phase difference output terminal 155.

Operation of this embodiment will be quantitatively described hereinafter. Referring to FIG. 13, the addition circuit 137 performs calculation as expressed by formula (40), where $\gamma^{(1)}_n, \ldots r^{(N)}_n$ denote N signals at time n and $g^{(1)}_n, \ldots g^{(N)}_n$ denote the estimated values of taps in the CIRs for the N signals.

$$\sum_{p=1}^{N} g^{(p)*}_n \cdot r^{(p)}_n \tag{40}$$

It is assumed here that a 4-ary PSK signal is received by the receiver. The decision circuit 15 outputs a decision value $J_n$ as $\exp(j\pi/4)$ when the sumation is present in the first quadrant of the complex plane. When the sumation is in the second quadrant, the decision circuit 15 outputs a decision value $J_n$ as $\exp(j3\pi/4)$. In the case of the third quadrant, a decision value $J_n$ as $\exp(j5\pi/4)$ is outputted. In the case of the fourth quadrant, a decision value $J_n$ as $\exp(j7\pi/4)$ is outputted. In the foregoing decision process, the soft decision is also applicable. In such a case, a sumation calculated using formula (40) will be outputted.

The CIR estimating circuit 132 estimates CIRs on the basis of the decision value $J_n$ and an estimated frequency offset $\Delta\omega_n$ (outputted from the frequency offset estimating circuit C 136). The LMS algorithm is applied here. The CIR estimating circuit 132 estimates the values of taps using the decision value $J_n$ and formula (41).

$$g^{(P)}_{n+1} = \{g^{(P)}_n + \delta\,(r^{(P)}_n - g^{(P)}_n J_n) J_n^*\} \exp(j\Delta\omega_n) \quad (41)$$

(P=1, ..., N)

where the portion in braces represents the values of taps $g^{(P)}_n$ updated according to the LMS algorithm, and the term $\exp(j\Delta\omega_n)$ is for compensating a rotational component of a phase due to the frequency offset.

Referring to FIG. 14, operation of the frequency offset estimating circuit C 136 will be described hereinafter with respect to the phase difference detecting circuit C 141. Operation of the phase difference smoothing circuit A 142 is the same as that described with respect to the first embodiment.

The phase difference detecting circuit C 141 calculates a phase difference on the basis of N received signals $r^{(P)}_n$ and the decision value $J_n$ and using formula (42). The phase differences are present between a span of M symbols.

$$\Delta W_n = (J_n J_{n-M})^* \cdot \sum_{p=1}^{N} r^{(p)}_n \cdot r^{(p)}_{n-M}{}^* \quad (42)$$

In this embodiment, diversity combining is performed using the CIRs of respectively received signals and the received signals. Decision values are obtained as estimated data through the diversity combining, and are output. Further, CIR for respective received signals are estimated using the decision value of the diversity combined signal. By adding the products of complex variable representing the CIRs and the received signals, the maximal-ratio combining can be performed. Further, a frequency offset is estimated using N received signals and decision values. The CIRs are phase-rotated according to the estimated frequency offset. Thus, it is possible to improve the bit error rate when there is a frequency offset.

With this embodiment, the diversity combining is performed using the CIRs which can represent carrier phases and envelop amplitude of the received signals. CIRs are estimated based on decision values which are derived using the result of the diversity combining and include some phase ambiguity. However, since the CIRs for N received signals are free from relative phase difference, no information is input to eliminate such a phase ambiguity for diversity combining. This assures that the diversity receiver has a reliable maximal-ratio combining, and reduces the bit error rate.

The LMS algorithm is used to estimate the CIRs in the foregoing description. Alternatively, the adaptive algorithm including the RLS algorithm may be used to recursively estimate CIRs. If CIRs vary very rapidly, they can be estimated accordingly.

The decision value is used to calculate the phase difference in the foregoing description. The phase difference can also be calculated using known information about a received signals in place of the decision value. Further, a table, in which an output signal of the decision value phase difference detecting circuit A 152 is stored when the known information about the received signals is available, and can be used in place of the decision value phase difference detecting circuit A 152.

The frequency offset estimating circuits C can also perform their function only on the basis of phase information as described with respect to the second embodiment. Further, the frequency offset estimating circuits C estimate a plurality of frequency offsets and fine-control frequency offset so that the frequency offset can be estimated precisely and extensively.

Embodiment 4

Figure 16:
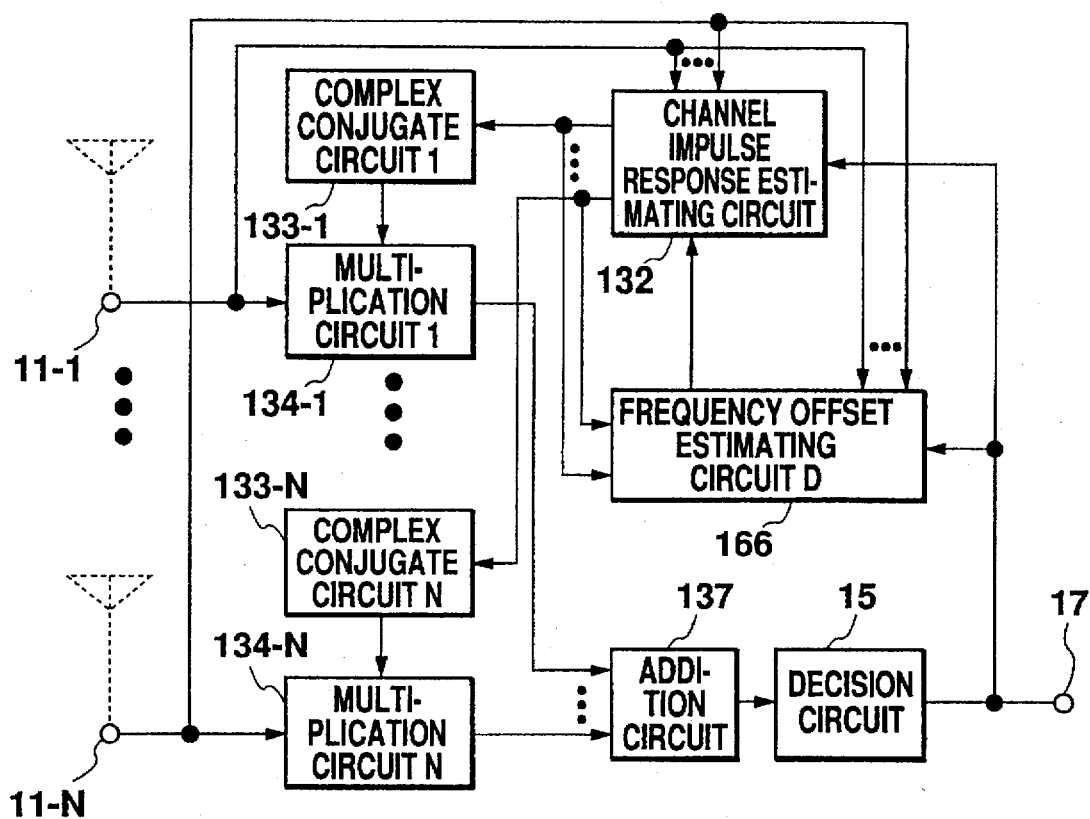
FIG. 16 shows the configuration of a receiver with the AFC function according to a fourth embodiment.

A receiver according to a fourth embodiment has the configuration as shown in FIG. 16.

The receiver comprises received signal input terminals 11-1–11-N, complex conjugate circuits 133-1–133-N, multiplication circuits 134-1–134-N, an addition circuit 137, a decision circuit 15, a frequency offset estimating circuit D (166), and a CIR estimating circuit 132. The complex conjugate circuits 133-1–133-N calculate complex conjugates. The multiplication circuits 134-1–134-N multiply the complex conjugates (from the complex conjugate circuits 133-1–133-N) and the received signals (via the input terminals 11-1–11-N) together. The addition circuit 137 adds the products (from the multiplication circuits 134-1 –134-N). The decision circuit 15 outputs a decision value, i.e. an estimated value of the transmitted data, on the basis of the sumation from the addition circuit 137. The frequency offset estimating circuit D 166 estimates frequency offsets on the basis of the decision value, the CIRs (from the CIR estimating circuit 132) and the signal received via the terminals 11-1–11-N. The CIR estimating circuit 132 estimates CIRs on the basis of the frequency offset (output by the frequency offset estimating circuit D 166,), the decision value and the received signals via terminals 11-1–11-N.

Figure 17:
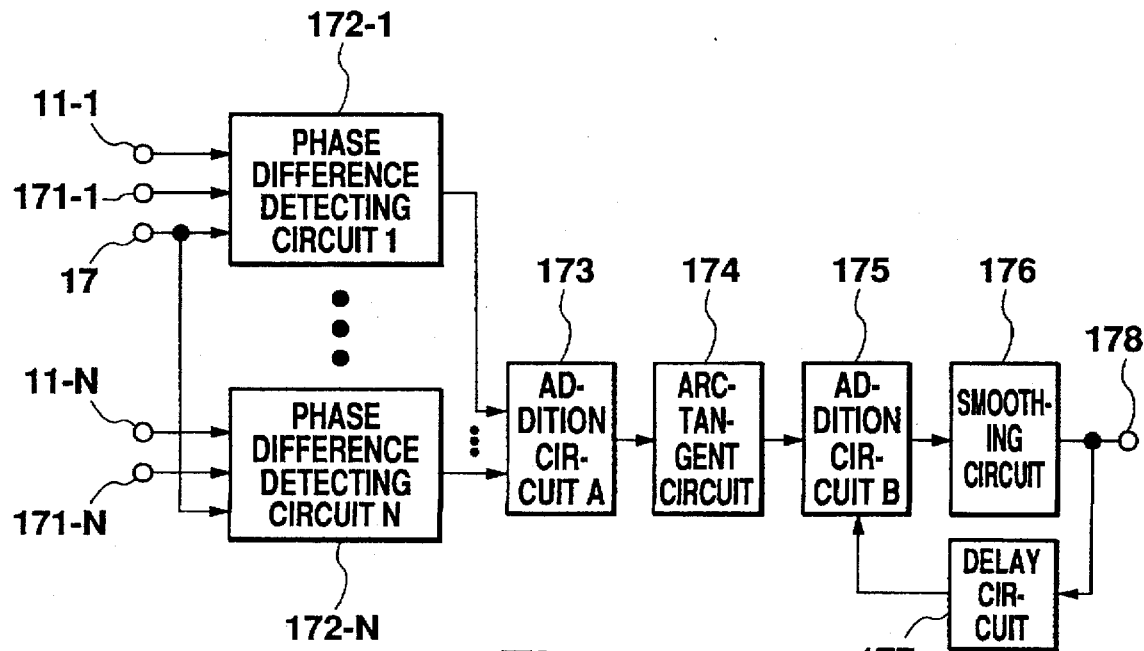
FIG. 17 shows the configuration of a frequency offset estimating circuit D in the receiver of FIG. 16.

The frequency offset estimating circuit D 166 of FIG. 13 is configured as shown in FIG. 17. In FIG. 17, reference numerals denote the following: 11-1–11-N received signal input terminals; 171-1–171-N CIR input terminals; 17 a decision value input terminal; 172-1–172-N phase difference detecting circuits; 173 an addition circuit A; 174 an arctangent circuit; 175 an addition circuit B; 176 a smoothing circuit; 177 a delay circuit; and 178 a frequency offset output terminal. Specifically, the phase difference detecting circuits 172-1–172-N detect phase differences of the N received signals on the basis of N received signals (via the terminals 11-1–11-N), CIRs for the N received signals, and a decision value (via the terminal 17), and phase differences occurring between spans of M symbols of the received signal. The addition circuit 173 adds N phase differences from the phase difference detecting circuits 172-1–172-N. The arctangent circuit 174 calculates an arctangent of the sumation. The addition circuit B 175 adds the arctangent and delay signals from the delay circuit 177. The smoothing circuit 176 smoothes the sumation from the addition circuit B 175. The delay circuit 177 delays the received signals by a symbol.

Figure 18:
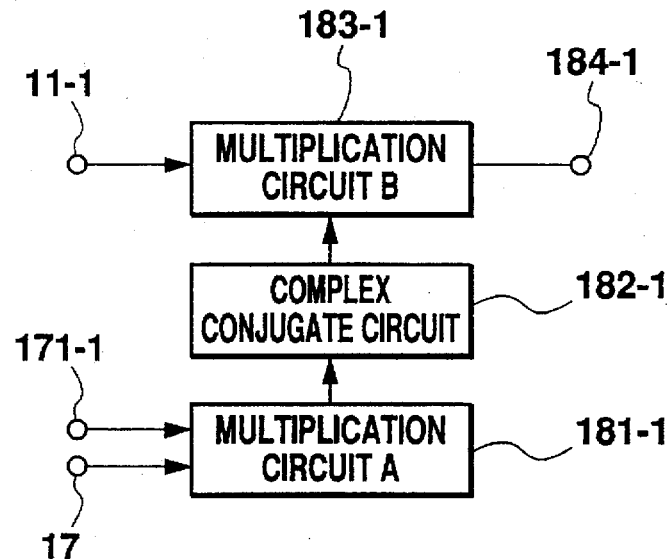
FIG. 18 shows the configuration of an example of a received signal phase difference detecting circuit in the frequency offset estimating circuit of FIG. 17.

The phase difference detecting circuit 172-1 of FIG. 17 is configured as shown in FIG. 18. Referring to FIG. 18, reference numerals denote the following: 11-1 a received signal input terminal; 17 a decision value input terminal; 171-1 a CIR input terminal; 181-1 a multiplication circuit A; 182-1 a complex conjugate circuit; 183-1 a multiplication circuit B; and 184-1 a phase difference output terminal. The multiplication circuit A (181-1) multiplies the CIR (from the CIR input terminal 171-1) and the decision value (from terminal 17). The complex conjugate circuit 182-1 calculates a complex conjugate of the product (from the multiplication circuit 181-1). The multiplication circuit B (183-1) multiplies the complex conjugate (from the complex conjugate circuit 182-1) and the received signal (via the input terminal 11-1).

The receiver of this embodiment operates in the following manner. Parts which are identical to those in the first embodiment are assigned identical reference numerals, and are not described here in detail. This embodiment differs from the third embodiment in the estimation of frequency offsets. This difference will be specifically described.

Referring to FIG. 17, the frequency offset estimating circuit D 166 operates in the following manner. The phase difference detecting circuits 172-1–172-N input N received signals via the signal input terminals 11-1–11-N, CIR via the CIR input terminals 171-1–171-N, and decision values via the decision value input terminal 17, detect phase differences of the respective signals, and output the phase differences.

The addition circuit A 173 adds N phase differences from the phase difference detecting circuit 172-1—172-N, and outputs a sumation to the arctangent circuit 174. The arctangent circuit 174 calculates an arctangent of the sumation, and outputs the arctangent value to the addition circuit B 175.

The addition circuit B 175 adds the arctangent (from the arctangent circuit 174) and the delay signal (from the delay circuit 177), and outputs the sumation to the smoothing circuit 176. The smoothing circuit 176 smoothes the sumation, and outputs the smoothed value as an estimated frequency output via the frequency offset output terminal 178.

Referring to FIG. 18, operation of the phase difference detecting circuit 172-1 (FIG. 17) will be described hereinafter. The multiplication circuit A 181-1 multiplies the CIR (via the CIR input terminal 171-1) and the decision value (via the decision value input terminal 17), and outputs a product to the complex conjugate circuit 182-1.

The complex conjugate circuit 182-1 calculates a complex conjugate of the product (from the multiplication circuit A 181-1), and outputs the complex conjugate to the multiplication circuit B 183-1. The multiplication circuit B 183-1 multiplies the complex conjugate and the received signal, and outputs the product as a phase difference of the received signal via the phase difference output terminal 184-1.

The foregoing operation will be described more quantitatively. In the circuit shown in FIG. 17, the addition circuit A 173 performs addition according to formula (43).

$$\epsilon_n = \sum_{p=1}^{N} r^{(p)}_n \cdot (g^{(p)}_n \cdot J_n)^* \tag{43}$$

where $r^{(1)}_n, \ldots, r^{(N)}_n$ denote N received signals at time n, $g^{(1)}_n, \ldots, g^{(N)}_n$ denote the values of estimated taps of CIRs, and $J_n$ denotes a decision value.

Formula (43) expresses a value obtained by maximal-ratio combining the phase difference between the received signal and the estimated received signal. The sumation output by the addition circuit B 175 is expressed by formula (44), and represents a frequency offset detected at time n.

$$\Delta\omega'_n = \epsilon_n + \Delta\omega_{n-1} \tag{44}$$

$\Delta\omega'_n$ is smoothed by the smoothing circuit 176 as in the second embodiment.

In this embodiment, diversity combining is performed using the CIRs of respectively received signals and the received signals. Decision values are obtained as estimated data through the diversity combining, and are output. Further, CIRs for respective received signals are estimated using the decision result of the diversity combining. By adding the products of complex variable representing the CIRs and the received signals the maximal ratio combing can be performed. Further, a frequency offset is estimated using N received signals, the CIRs and decision values. The CIRs are phase-rotated according to the estimated frequency offset. Thus, it is possible to improve the bit error rate when there is a frequency offset.

Further with the present invention, the CIRs which can represent carrier phases and amplitude of envelopes are used to perform diversity combining. Since decision values obtained using the results of the diversity combining are used to estimate CIRs, and contain phase ambiguity. However, the CIRs for N received signals are free from relative phase difference, and it is not necessary to input information for diversity combining so as to eliminate the relative phase difference. Thus, it is possible to provided a receiver with maximal-ratio combining. Further, it is possible to improve the bit error rate of the receiver.

The LMS algorithm is used to estimate the CIRs in the foregoing description. Alternatively, the adaptive algorithm including the RLS algorithm is applicable to such estimation. If CIRs vary very rapidly, they can be estimated accordingly.

The decision value is used to calculate the phase difference in the foregoing description. The phase difference can be also calculated using known information about the received signals in place of the decision value. Further, the frequency offset estimating circuit C can operate on the basis of only the phase information, as in the second embodiment.

The bit error rate of a succeeding Viterbi decoder can be improved by outputting a soft-decision value.

What is claimed is:

1. A receiver with automatic frequency control comprising:
   (a) data decision means for inputting a received signal and channel impulse response (CIR) including either a carrier phase or a carrier phase and amplitude, and for outputting a decision value of the received signal;
   (b) CIR estimating means for estimating CIR on the basis of the decision value from the data decision means and an estimated frequency offset of the received signal, the carrier phase or the carrier phase and amplitude of the CIR; and
   (c) frequency offset estimating means for estimating the estimated frequency offset of the received signal on the basis of either the decision value and the decision value delayed by M (M=an integer equal to or greater than 1) symbols or the information that is known about the received signal, the received signal, and the received signal delayed by M symbols, wherein the receiver performs automatic frequency control using the estimated frequency offset.

2. A receiver with automatic frequency control comprising:
   (a) data decision means for inputting a received signal, whose phase and/or amplitude is compensated, and outputting a decision value of the received signal;
   (b) channel impulse response (CIR) estimating means for estimating CIR on the basis of the decision value or information that is known about the received signal;
   (c) frequency offset estimating means for estimating the estimated frequency offset of the received signal on the basis of either the decision value and the decision value delayed by M (M=an integer equal to or greater than 1) symbols or the information that is known about the received signal, the received signal, and the received signal delayed by M symbols; and
   (d) means for compensating a phase and/or amplitude of the received signal in accordance with the CIR received from the CIR estimating means, wherein the receiver performs automatic frequency control using the estimated frequency offset.

3. The receiver with automatic frequency control according to claim 1 or 2, wherein the frequency offset estimating means estimates a frequency offset on the basis of the received signal and the received signal delayed by M (M=an integer equal to or greater than 1) symbol, and the information that is known about the received signal.

4. The receiver with automatic frequency control according to claim 1 or 2, wherein the frequency offset estimating means includes:

S (S is an integer equal to or greater than 2) frequency offset estimating means for estimating the estimated frequency offset of the received signal on the basis of the decision value and a decision value of a received signal delayed by $M_1, M_2, \ldots,$ or $M_s$ symbols; and fine frequency control means for fine-controlling the estimated frequency offsets received from the S frequency offset estimating means.

5. The receiver with automatic frequency control according to claim 1 or 2, wherein the frequency offset estimating means further includes:

a first frequency offset estimating circuit for inputting the decision value or the information that is known about the received signal, and for estimating a first frequency offset of the received signal on the basis of the decision value of the received signal and the decision value delayed by $M_1$ symbols or the information that is known about the received signal, the received signal and the received signal delayed by $M_1$ symbols; and a (i+1)-th frequency offset estimating circuit for estimating an (i+1)-th frequency offset of the received signal on the basis of the decision value of the received signal and the decision value delayed by $M_{i+1}$ symbols or the information that is known about the received signal, an i-th estimated frequency offset derived by an I-th estimated frequency offset estimating means (I=1~S−1; S=an integer equal to or greater than 2), the received signal, and the received signal delayed by $M_{i+1}$ symbols.

6. The receiver with automatic frequency control according to claim 1 or 4, wherein the frequency offset estimating means includes:

phase difference detecting means for a detecting a phase difference between the received signal and the received signal delayed by M symbols, on the basis of the decision value and a decision value delayed by M symbols or the information that is known about the received signal, the received signal and the received signal delayed by M symbols; and phase difference smoothing means for smoothing the phase difference detected by the phase difference detecting means, and outputting the estimated frequency offset.

7. The receiver with automatic frequency control according to claim 1 or 2, wherein the frequency offset estimating means estimates a frequency offset on the basis of the decision value or the information that is known about the received signal, the received signal and the CIR estimated by the CIR estimating means.

8. The receiver with automatic frequency control according to claim 6, wherein the phase difference detecting means outputs a signal of phase differences expressed by complex variables, and the phase differences smoothing means includes;

smoothing means for smoothing the phase differences between spans of M symbols and expressed by complex variables;

arctangent calculating means for receiving the phase differences averaged by the smoothing means, converting the phase differences into complex variables to phases, and outputting the phases; and dividing means for receiving the phases and calculating a phase difference per symbol.

9. A receiver with automatic frequency control comprising:

(a) data decision means for inputting N (art integer equal to or greater than 1) received signals and channel impulse response (CIR) that includes either a carrier phase or a carrier phase and amplitude, and outputting a decision value of the received signal;

(b) CIR estimating means for estimating CIR on the basis of the decision value from the data decision means and an estimated frequency offset of the received signal, the carrier phase or the carrier phase and amplitude of the CIR; and (c) frequency offset estimating means for estimating the estimated frequency offset on the basis of either the decision value and the decision value delayed by M (M=an integer equal to or greater than 1) symbols or the information that is known about the N received signals, the N received signals, and the N received signals delayed by M symbols, wherein the receiver performs automatic frequency control using the estimated frequency offset.

10. A receiver with automatic frequency control comprising:

(a) data decision means for inputting a signal combined N received signals (N=an integer equal to or greater than 1), and outputting decision values of the received signal;

(b) channel impulse response (CIR) estimating means for estimating CIR of the N received signals on the basis of either the decision values from the data decision means, or an estimated frequency offset of the combined signal;

(c) frequency offset estimating means for estimating frequency offset of the combined signal on the basis of either the decision value and the decision value delayed by M (M=an integer equal to or greater than 1) symbols or the information that is known about the received signals, the N received signals delayed by M symbols; and (d) combination means for combining the N received signals on the basis of the CIR thereof.

wherein the receiver performs automatic frequency control using the estimated frequency offset.

11. The receiver with automatic frequency control according to claim 9 or 10, wherein the frequency offset estimating means estimates a frequency offset on the basis of the N received signals and the N received signals delayed by M (an integer equal to or greater than 1) symbols, and the information that is known about the received signals.

12. The receiver with automatic frequency control according to claim 9 or 10, wherein the frequency offset estimating means includes:

S (S is an integer equal to or greater than 2) frequency offset means for estimating the estimated frequency offset of the combined signal on the basis of the decision value and the decision value delayed by $M_1, M_2, \ldots,$ or $M_s$ symbols or the information that is known about the received signals, the N received signals, and the N received signals delayed by $M_1, M_2, \ldots$ or $M_s$ symbols; and fine frequency offset control means for fine-controlling the estimated frequency offsets received from the S frequency offsets estimating means.

13. The receiver with automatic frequency control according to claim 9 or 10, wherein the frequency offset estimating means further includes:

a first frequency offset estimating means for inputting the decision value and the N received signals, and for estimating a first frequency offset of the combined signal on the basis of the decision value and of the combining signal and the decision value delayed by $M_1$ symbols or the information that is known about the received signal, the N received signals and the N received delayed by $M_1$ symbols; and a (I–1)-th frequency offset estimating means for estimating an (I+1)-th frequency offset of the combined signal on the basis of the decision value of the combining signal and the decision value delayed by $M_{I+1}$ symbols or the information that is known about the received signals, an I-th estimated frequency offset derived by an I-th frequency offset estimating means (I=1~S–1; S=an integer equal to or greater than 2), the N received signals, and the N received signal delayed by $M_{I+1}$ symbols.

14. The receiver with automatic frequency control according to claim 9 or 10, wherein the frequency offset estimating means estimates a frequency offset on the basis of the decision value or the information that is known about the received signals, and the N received signals, and the N CIRs estimated by the N CIR estimating means respectively.

15. The receiver with automatic frequency control according to claim 9 or 10, wherein the frequency offset estimating means includes:

phase difference detecting means for detecting a phase difference between the combined signal and the combined signal delayed by M symbols on the basis of the decision value and a decision value delayed by M symbols or the information that is known about the received signal, the N received signals, the N received signals delayed by M symbols; and phase difference smoothing means for smoothing the phase differences detected by the phase difference detecting means, and outputting the estimated frequency offset.

16. The receiver with automatic frequency control according to claim 6, wherein the phase difference detecting means outputs phase differences expressed by complex variables, and the phase smoothing means includes:

arctangent calculating means for receiving the phase differences between spans of M symbols from the phase difference detecting means and for converting the phase differences to phases and for outputting the phases: and smoothing means for smoothing the phases and dividing by M so as to estimate a phase difference per symbol.

17. The receiver with automatic frequency control according to claim 3, wherein the frequency offset estimating means includes:

S (S is an integer equal to or greater than 2) frequency offset estimating means for estimating the estimated frequency offset of the received signal on the basis of the decision value and a decision value of a received signal delayed by $M_1, M_2, \ldots$, or $M_s$ symbols; and fine frequency control means for fine-controlling the estimated frequency offsets received from the S frequency offset estimating means.

18. The receiver with automatic frequency control according to claim 3, wherein the frequency offset estimating means further includes:

a first frequency offset estimating circuit for inputting the decision value or predetermined information about the received signal, and for estimating a first frequency offset of the received signal on the basis of the decision value of the received signal and the decision value delayed by $M_1$ symbols or information that is known about the received signal, the received signal and the received signal delayed by $M_1$ symbols; and a (i+1)-th frequency offset estimating circuit for estimating an (i+1)-th frequency offset of the received signal on the basis of the decision value of the received signal and the decision value delayed by $M_{i+1}$ symbols or the information that is known about the received signal, an i-th estimated frequency offset derived by an I-th estimated frequency offset estimating means (I=1~S–1; S=an integer equal to or greater than 2), the received signal, and the received signal delayed by $M_{i+1}$ symbols.

19. The receiver with automatic frequency control according to claim 3, wherein the frequency offset estimating means estimates a frequency offset on the basis of the decision value or the information that is known about the received signal, the received signal, and the CIR estimated by the CIR estimating means.

20. The receiver with automatic frequency control according to claim 4, wherein the frequency offset estimating means includes:

phase difference detecting means for a detecting a phase difference between the received signal and the received signal delayed by M symbols, on the basis of the decision value and a decision value delayed by M symbols or the information that is known about the received signal, the received signal, and the received signal delayed by M symbols; and phase difference smoothing means for smoothing the phase difference detected by the phase difference detecting means, and outputting the estimated frequency offset.

21. The receiver with automatic frequency control according to claim 5, wherein the frequency offset estimating means includes:

phase difference detecting means for a detecting a phase difference between the received signal and the received signal delayed by M symbols, on the basis of the decision value and a decision value delayed by M symbols or the information that is known about the received signal, the received signal, and the received signal delayed by M symbols; and phase difference smoothing means for smoothing the phase difference detected by the phase difference detecting means, and outputting the estimated frequency offset.

22. The receiver with automatic frequency control according to claim 11, wherein the frequency offset estimating means includes:

S (S is an integer equal to or greater than 2) frequency offset means for estimating the estimated frequency offset of the combined signal on the basis of the decision value and the decision value delayed by $M_1$, $M_2, \ldots$, or $M_s$ symbols or the information that is known about the received signal, the N received signals, and the N received signals delayed by $M_1, M_2$, ... or $M_s$ symbols; and fine frequency offset control means for fine-controlling the estimated frequency offsets received from the S frequency offsets estimating means.

23. The receiver with automatic frequency control according to claim 11, wherein the frequency offset estimating means further includes:

a first frequency offset estimating means for inputting the decision value and the N received signals, and for estimating a first frequency offset of the combined signal on the basis of the decision value and of the combining signal and the decision value delayed by $M_1$ symbols or the information that is known about the received signal, predetermined information about the received signal, the N received signals and the N received delayed by $M_1$ symbols; and a (I−1)-th frequency offset estimating means for estimating an (I+1)-th frequency offset of the combined signal on the basis of the decision value of the combining signal and the decision value delayed by $M_{1+1}$ symbols or the information that is known about the received signal, an I-th estimated frequency offset derived by an I-th frequency offset estimating means (I=1~S−1; S=an integer equal to or greater than 2), the N received signals, and the N received signal delayed by $M_{1+1}$ symbols.

24. The receiver with automatic frequency control according to claim 11, wherein the frequency offset estimating means estimates a frequency offset on the basis of the decision value or the information that is known about the received signal, the N received signals, and the N CIRs estimated by the N CIR estimating means respectively.

25. The receiver with automatic frequency control according to claim 12, wherein the frequency offset estimating means includes:

phase difference detecting means for detecting a phase difference between the combined signal and the combined signal delayed by M symbols on the basis of the decision value and a decision value delayed by M symbols or the information that is known about the received signal, the N received signals, the N received signals delayed by M symbols; and phase difference smoothing means for smoothing the phase differences detected by the phase difference detecting means, and outputting the estimated frequency offset.

26. The receiver with automatic frequency control according to claim 13, wherein the frequency offset estimating means includes:

phase difference detecting means for detecting a phase difference between the combined signal and the combined signal delayed by M symbols on the basis of the decision value and a decision value delayed by M symbols or the information that is known about the received signal, the N received signals, the N received signals delayed by M symbols; and phase difference smoothing means for smoothing the phase differences detected by the phase difference detecting means, and outputting the estimated frequency offset.

27. The receiver with automatic frequency control according to claim 15 wherein the phase difference detecting means outputs a signal of phase differences expressed by complex variables, and the phase differences smoothing means includes:

smoothing means for smoothing the phase differences between spans of M symbols and expressed by complex variables;

arctangent calculating means for receiving the phase differences averaged by the smoothing means, converting the phase differences into complex variables to phases, and outputting the phases; and dividing means for receiving the phases and calculating a phase difference per symbol.

28. The receiver with automatic frequency control according to claim 15, wherein the phase difference detecting means outputs phase differences expressed by complex variables, and the phase differences smoothing means includes:

arctangent calculating means for receiving the phase differences between spans of M symbols from the phase difference detecting means and for converting the phase differences to phases and for outputting the phases; and smoothing means for smoothing the phases and dividing by M so as to estimate a phase difference per symbol.

* * * * *